(12) United States Patent
Lin et al.

(10) Patent No.: US 12,550,417 B2
(45) Date of Patent: Feb. 10, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Yu-Hung Lin, Taichung (TW); Jih-Churng Twu, Hsinchu (TW); Su-Chun Yang, Hsinchu (TW); Shih-Peng Tai, Xinpu Township (TW); Yu-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 388 days.

(21) Appl. No.: 18/353,389

(22) Filed: Jul. 17, 2023

(65) Prior Publication Data
US 2025/0031434 A1    Jan. 23, 2025

(51) Int. Cl.
*H10D 84/03*    (2025.01)
*H01L 21/3065*    (2006.01)
(Continued)

(52) U.S. Cl.
CPC ....... *H10D 84/038* (2025.01); *H01L 21/3065* (2013.01); *H01L 21/31116* (2013.01);
(Continued)

(58) Field of Classification Search
CPC .. H10D 84/038; H10D 88/01; H01L 21/3065; H01L 21/31116; H01L 21/561; H01L 23/3128; H01L 23/49827; H01L 24/05; H01L 24/11; H01L 24/32; H01L 25/0657; H01L 2224/05024; H01L 2224/11462; H01L 2224/11612; H01L 2224/32146; H01L 2224/32235; H01L 2225/06513;
(Continued)

(56) References Cited

U.S. PATENT DOCUMENTS 11,830,861 B2    11/2023   Liao et al.
2013/0292719 A1 *  11/2013   Lee ................. H10H 29/142
                                                     257/93

(Continued)

FOREIGN PATENT DOCUMENTS

TW        202013910 A      4/2020
WO    WO-9323972 A1 *    11/1993  ............. H05B 33/22

*Primary Examiner* — Douglas W Owens
(74) *Attorney, Agent, or Firm* — Slater Matsil, LLP

(57) ABSTRACT

A method includes bonding a first semiconductor die and a second semiconductor die to a substrate, where a gap is disposed between a first sidewall of the first semiconductor die and a second sidewall of the second semiconductor die, performing a plasma treatment to dope top surfaces and sidewalls of each of the first semiconductor die and the second semiconductor die with a first dopant, where a concentration of the first dopant in the first sidewall decreases in a vertical direction from a top surface of the first semiconductor die towards a bottom surface of the first semiconductor die, and a concentration of the first dopant in the second sidewall decreases in a vertical direction from a top surface of the second semiconductor die towards a bottom surface of the second semiconductor die, and filling the gap with a spin-on dielectric material.

20 Claims, 18 Drawing Sheets

(51) Int. Cl.
*H01L 21/311* (2006.01)
*H01L 21/56* (2006.01)
*H01L 23/00* (2006.01)
*H01L 23/31* (2006.01)
*H01L 23/498* (2006.01)
*H01L 25/065* (2023.01)
*H10D 88/00* (2025.01)

(52) U.S. Cl.
CPC ........ *H01L 21/561* (2013.01); *H01L 23/3128* (2013.01); *H01L 23/49827* (2013.01); *H01L 24/05* (2013.01); *H01L 24/11* (2013.01); *H01L 24/32* (2013.01); *H01L 25/0657* (2013.01); *H10D 88/01* (2025.01); *H01L 2224/05024* (2013.01); *H01L 2224/05647* (2013.01); *H01L 2224/11462* (2013.01); *H01L 2224/11612* (2013.01); *H01L 2224/32146* (2013.01); *H01L 2224/32235* (2013.01); *H01L 2225/06513* (2013.01); *H01L 2225/06541* (2013.01); *H01L 2924/15311* (2013.01); *H01L 2924/182* (2013.01)

(58) Field of Classification Search
CPC . H01L 2225/06541; H01L 2924/15311; H01L 2924/182; H01L 21/6835; H01L 23/49816; H01L 24/08; H01L 24/19; H01L 24/80; H01L 25/18; H01L 25/50; H01L 24/02; H01L 21/2236; H01L 21/265; H01L 21/56; H01L 23/291; H01L 23/3114; H01L 23/3121; H01L 23/5386; H01L 23/5389; H01L 2224/0231; H01L 2224/02381
See application file for complete search history.

(56) References Cited

U.S. PATENT DOCUMENTS

| | | | |
|---|---|---|---|
| 2015/0270232 A1* | 9/2015 | Chen | H01L 25/105 257/691 |
| 2015/0287699 A1* | 10/2015 | McConnelee | H01L 24/83 257/774 |
| 2020/0258816 A1* | 8/2020 | Okina | H10B 43/40 |
| 2020/0294915 A1* | 9/2020 | Chu | H01L 24/09 |
| 2021/0057303 A1* | 2/2021 | Chen | H01L 21/02274 |
| 2021/0408258 A1* | 12/2021 | Lavric | H10D 30/024 |
| 2024/0371818 A1* | 11/2024 | Yang | H01L 24/97 |

* cited by examiner

INTEGRATED CIRCUIT PACKAGES AND
METHODS OF FORMING THE SAME

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
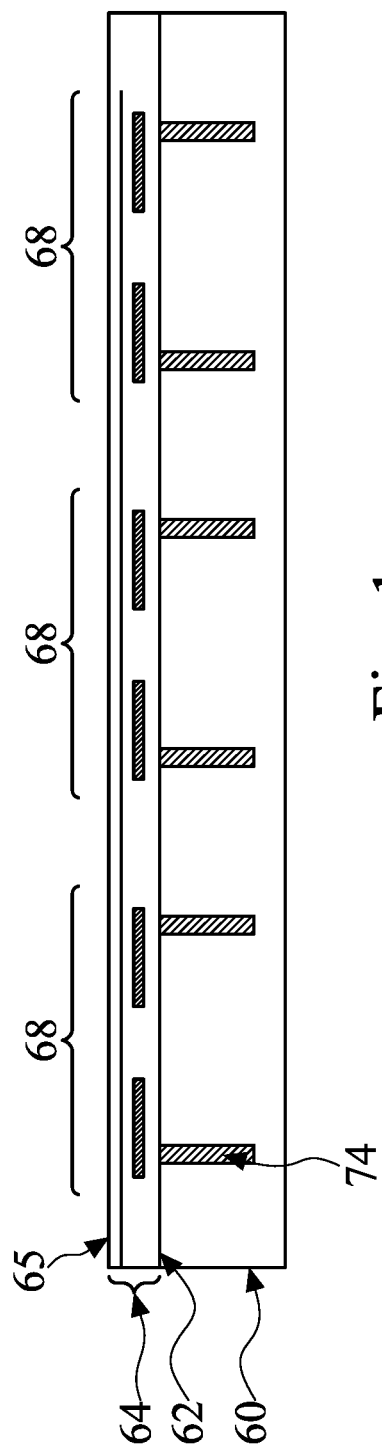
FIGS. 1 through 4B illustrate cross-sectional views of intermediate steps during a process of forming an integrated circuit device stack 10, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a method of forming an integrated circuit package and the resulting structure. In some embodiments, semiconductor dies may be bonded to a substrate, and a plasma treatment is performed to dope top surfaces and sidewalls of each of the semiconductor dies with a suitable dopant (e.g., fluorine). A doping concentration of the dopant in respective sidewalls of each of the semiconductor dies may decrease in a vertical direction away from the top surfaces of the semiconductor dies. A gap-filling process is then performed to fill gaps between the semiconductor dies with a dielectric material.

As a result of the doping profiles of the semiconductor dies, an increased hydrophobicity of the top surfaces and upper sidewalls of the semiconductor dies can be achieved compared to lower sidewalls of the semiconductor dies. For example, the hydrophobicity of the sidewalls of the semiconductor dies decreases in a vertical direction away from the top surface of the semiconductor dies. As a result, during the gap-filling process, the increased hydrophobicity of top portions of the semiconductor dies compared to bottom portions of the semiconductor dies may allow for the dielectric material to fill and adhere to the bottom portions of the semiconductor dies before filling and adhering to the top portions of the semiconductor dies. This allows the gap to be filled from the bottom-up, allowing for gaps of a larger depth to be filled without the formation of large voids. As a result, device reliability and performance are improved. The bottom-up filling process may further reduce the roughness of the dielectric material, allowing for an improved interface with overlying structures of the integrated circuit package and improved device reliability. In addition, after the gap-filling process, no residue remains on the top surfaces of the semiconductor dies, removing the need for a cleaning process after the gap-filling process is performed and reducing manufacturing costs.

FIGS. 1 through 15 illustrate cross-sectional views of intermediate stages in the manufacturing of an integrated circuit device stack 10 in accordance with some embodiments. FIG. 1 illustrates a wafer including one or more dies 68. A substrate 60 of the wafer may include a bulk semiconductor substrate, semiconductor-on-insulator (SOI) substrate, multi-layered semiconductor substrate, or the like. The semiconductor material of the substrate 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 60 may be doped or undoped. Devices, such as transistors, capacitors, resistors, diodes, and the like, may be formed in and/or on an active surface 62 of the substrate 60.

Through-vias (TVs) 74 are formed to extend from the active surface 62 of the substrate 60 into the substrate 60. The TVs 74 are also sometimes referred to as through-substrate vias, or through-silicon vias when the substrate 60 is a silicon substrate. The TVs 74 may be formed by forming recesses in the substrate 60 by, for example, etching, milling, laser techniques, a combination thereof, and/or the like. A thin barrier layer may be conformally deposited over the substrate 60 and in the recesses, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the recesses. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer over the substrate 60 are removed by, for example, CMP. Thus, the TVs 74 may comprise a conductive material and a thin barrier layer between the conductive material and the substrate 60.

An interconnect structure 64 comprising one or more dielectric layer(s) and respective metallization pattern(s) is formed on the active surface 62. The metallization pattern(s) in the dielectric layer(s) may route electrical signals between the devices and/or the TVs 74, such as by using vias and/or traces, and may also contain various electrical devices, such as capacitors, resistors, inductors, or the like. The various devices and metallization patterns may be interconnected to form integrated circuits that perform one or more functions. The integrated circuits may include memories, processors, sensors, amplifiers, power distribution devices, input/output circuitry, or the like. Additionally, a topmost dielectric layer of the interconnect structure 64 may function as a bonding layer 65 for subsequent bonding to a carrier substrate 70 (described in FIG. 3).

As an example to form a layer of the interconnect structure 64, an inter-metallization dielectric (IMD) layer may be formed. The IMD layer may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP). Additional layers of the interconnect structure 64 may be formed by repeating these steps. The bonding layer 65 may be deposited over the additional layers of the interconnect structure 64. In some embodiments, the bonding layer 65 may be an oxide, such as silicon oxide, silicon oxynitride, the like, or a combination thereof, and may be formed by HDP-CVD, FCVD, CVD, ALD, PVD, the like, or a combination thereof.

Figure 2:
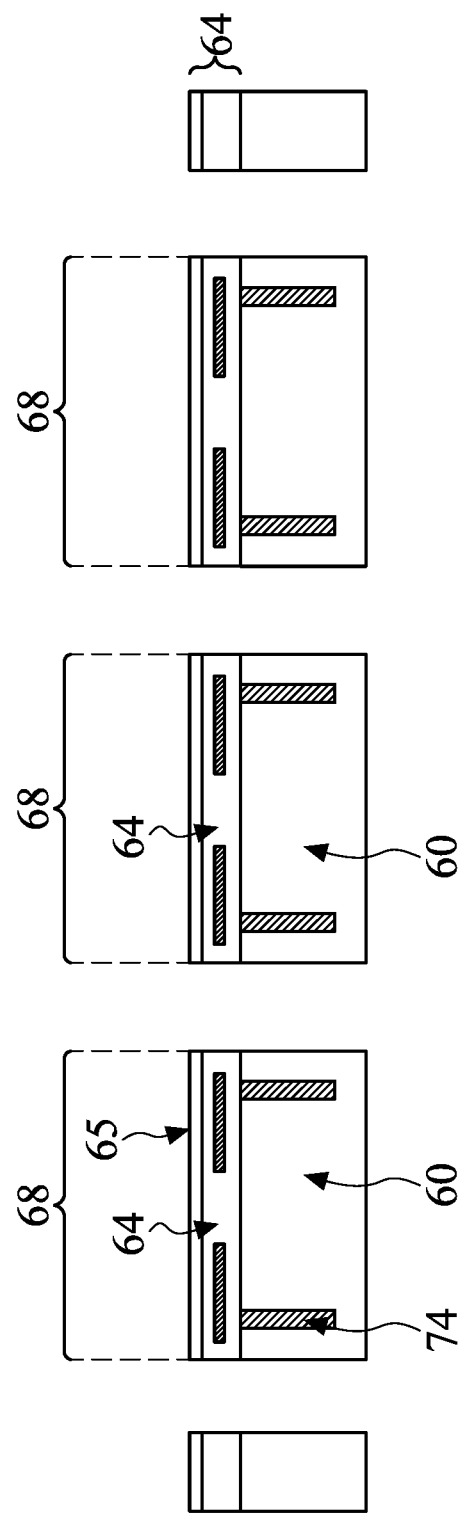

In FIG. 2, the substrate 60 including the interconnect structure 64 is singulated into individual dies 68. Typically, each of the dies 68 contains the same circuitry, such as the same devices and metallization patterns, although some or all of the dies 68 may have different circuitry. The singulation may include sawing, dicing, or the like.

The dies 68 may include logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may have different surface areas, and in other embodiments, each of the dies 68 may have the same surface areas.

Figure 3:
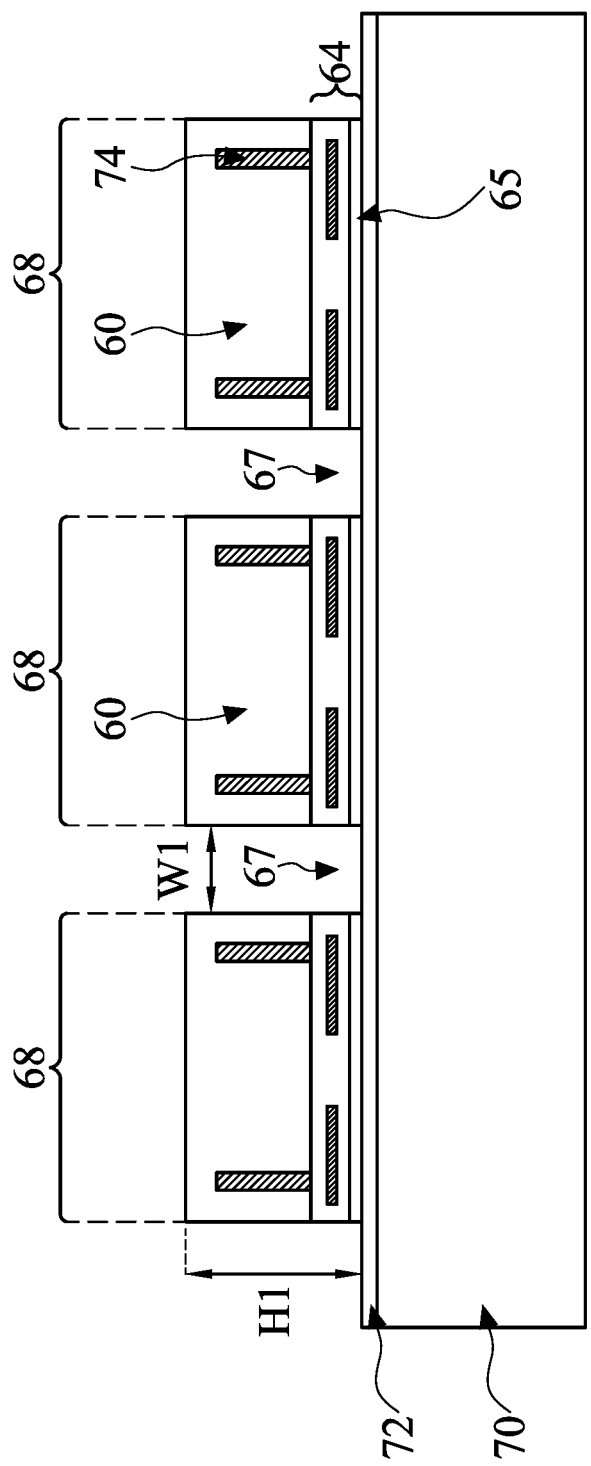

FIG. 3 illustrates the bonding of the dies 68 to a carrier substrate 70. A bonding layer 72 may be formed over the carrier substrate 70, and the bonding layer 65 of each die 68 is bonded to the bonding layer 72 on the carrier substrate 70. The bonding layer 72 may comprise an oxide, such as silicon oxide, silicon oxynitride, the like, or a combination thereof, and may be formed by high density plasma chemical vapor deposition (HDP-CVD), a flowable CVD (FCVD) (e.g., a CVD-based material deposition in a remote plasma system and post curing to make it convert to the oxide), atomic layer deposition, (ALD), physical vapor deposition (PVD), the like, or a combination thereof. Other oxide materials formed by any acceptable process may be used to form the bonding layer 72 over the carrier substrate 70.

In an embodiment, each of the dies 68 may be bonded to the carrier substrate 70 through a dielectric-to-dielectric bonding process (e.g., oxide-to-oxide bonding) forming a dielectric-to dielectric bond (e.g., an oxide-to-oxide bond). The dielectric-to-dielectric bond may be initiated by activating the bonding layer 65 and/or the bonding layer 72 followed by applying pressure, heat and/or other bonding process steps to join the bonding layer 65 to the bonding layer 72 surfaces. The activating the bonding layer 65 and the bonding layer 72 may be performed using, e.g., a dry treatment, a wet treatment, a plasma treatment, exposure to $H_2$, exposure to $N_2$, exposure to $O_2$, combinations of these, or the like. In embodiments where a wet treatment is used, an RCA cleaning process may be used, for example. The activating assists in the dielectric-to-dielectric bonding of the bonding layer 65 and the bonding layer 72 by, e.g., allowing the use of lower pressures and temperatures in subsequent dielectric-to-dielectric bonding processes. Through the treatment, the number of OH groups at surface(s) of the bonding layer 65 and/or the bonding layer 72 increases. After surfaces of the bonding layer 65 and/or the bonding layer 72 are activated, the bonding layer 65 and the bonding layer 72 may be contacted together at a relatively low temperature (e.g., room temperature) to form weak bonds. Subsequently, an annealing is performed to strengthen the weak bonds and form a dielectric-to-dielectric bond. During the annealing, the H of the OH bonds is outgassed, thereby forming Si—O—Si bonds between the bonding layer 65 and the bonding layer 72, thereby strengthening the bonds.

After the bonding of the dies 68 to the carrier substrate 70, gaps 67 may be disposed between adjacent dies 68. For example, a width W1 of a gap 67 between a first sidewall of a first die 68 and a second sidewall of an adjacent die 68 is in a range from 10 μm to 200 μm. In an embodiment, a height H1 of each die 68 is in a range from 100 μm to 500 μm, and each gap 67 may have a depth that is in a range from 100 μm to 500 μm.

Figure 4A:
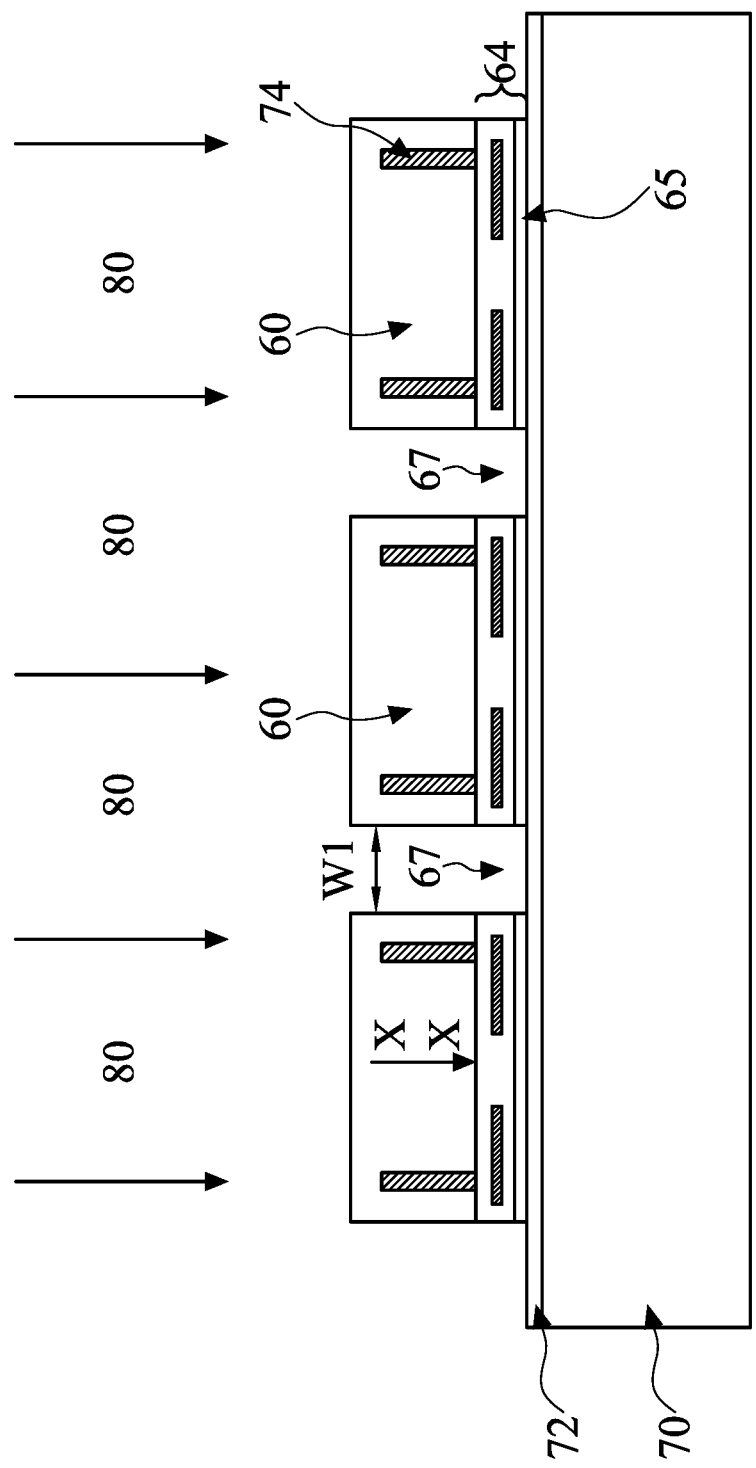

In FIG. 4A, a plasma treatment 80 is performed on the structure shown in FIG. 3 to dope top surfaces and sidewalls of each of the dies 68 with fluorine. Specifically, a top surface and sidewalls of a substrate 60 of each die 68 is doped with fluorine. The plasma treatment 80 is performed using a power source, such as radio frequency (RF) or direct current (DC) to excite a gas mixture that comprises fluorine and generate a fluorine plasma. The fluorine plasma is formed when the gas molecules of the gas mixture are ionized and dissociated into charged particles, such as ions and electrons. The gas mixture may comprise $CF_4$, $C_2F_6$, $C_4F_8$, or the like. The top surface and the sidewalls of a substrate 60 of each die 68 are exposed to the fluorine plasma for a specific duration, which allows the fluorine atoms to penetrate a material of the substrate 60, and substitute for some of the atoms in the lattice structure of the substrate 60. The amount of fluorine doping can be controlled by adjusting the duration of the exposure and the concentration of fluorine in the gas mixture. After the plasma treatment 80 is performed, a doping concentration of fluorine in a top surface of each die 68 decreases in a vertical direction from the top surface towards a bottom surface of the die 68 as indicated by arrow X-X. In addition, a doping concentration and a doping depth D2 (shown subsequently in FIG. 5) of fluorine in each sidewall of the die 68 decreases in the same vertical direction as the arrow X-X from the top surface of the die 68 towards the bottom surface of the die 68. In other embodiments, the top surfaces and the sidewalls of each of the dies 68 may be doped with boron or phosphorus instead of fluorine. These can also be achieved by using plasma-based techniques.

Figure 4B:
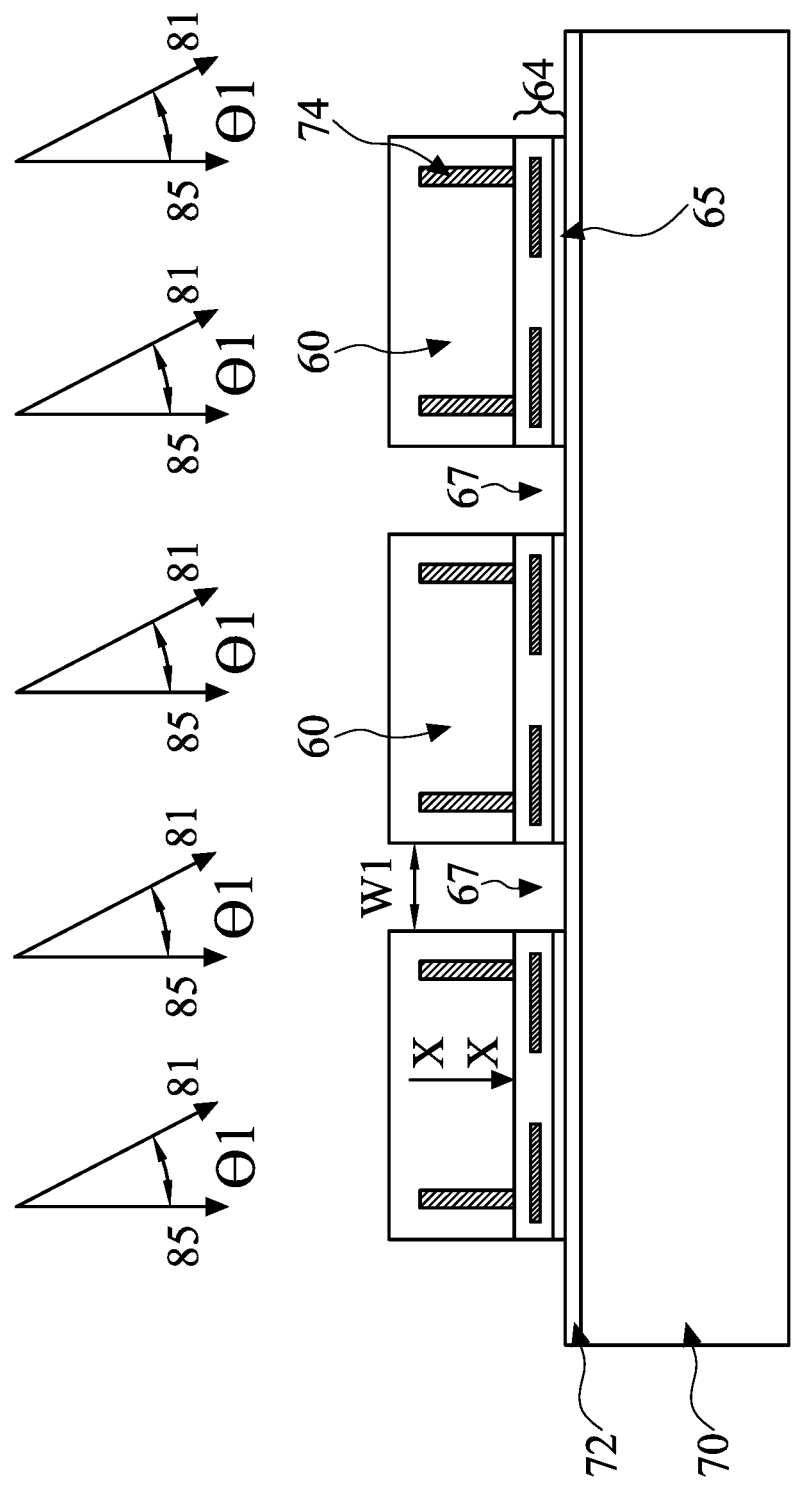

FIG. 4B shows an implantation process 81 that can be performed on the structure shown in FIG. 3 as an alternative to performing the plasma treatment 80 described previously in FIG. 4A. The implantation process 81 can be performed instead of the plasma treatment 80 described previously in FIG. 4A. The implantation process 81 may be an ion beam implantation process that is performed on the structure shown in FIG. 3 to dope top surfaces and sidewalls of each of the dies 68 with fluorine. Specifically, a top surface and sidewalls of a substrate 60 of each die 68 is doped with fluorine. In the implantation process 81, implantation species (e.g. fluorine dopants) are introduced using ion species that are ionized and accelerated to impact into substrate 60 of each die 68 using a number of ion beams. This will result in thousands of atoms of the substrate 60 of each die 68 being displaced from each ion implant, and the subsequent distribution of fluorine dopants within the substrate 60. The amount of fluorine doping can be controlled by varying the energies and the doses of the number of ion beams. As shown in FIG. 4B, the implantation process 81 may direct the implantation species (e.g. fluorine dopants) at a tilt angle θ1 with respect to an axis 85 that is perpendicular to the major surface of the carrier substrate 70. In some embodiments, the tilt angle θ1 may be in a range from 0° to 15°. Performing the implantation process 81 by directing the implantation species (e.g. fluorine dopants) at the tilt angle θ1 makes it possible to dope the sidewalls of each of the dies 68 with fluorine. After the implantation process 81 is performed, a doping concentration of fluorine in a top surface of each die 68 decreases in a vertical direction from the top surface moving towards a bottom surface of the die 68 as indicated by arrow X-X. In addition, a doping concentration and a doping depth D2 (shown subsequently in FIG. 5) of fluorine in each sidewall of the dies 68 decreases in the vertical direction of the arrow X-X from the top surface of the die 68 towards the bottom surface of the die 68.

Figure 5:
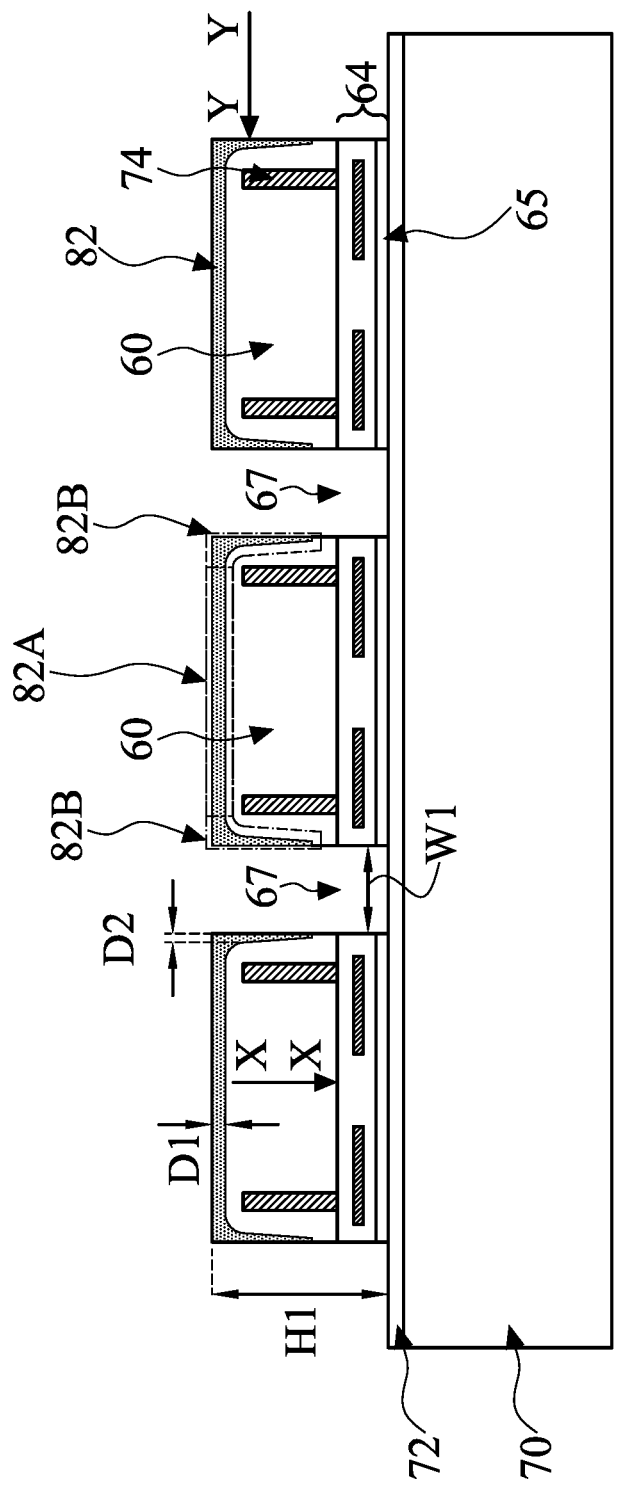
FIGS. 5 through 15 illustrate cross-sectional views of intermediate steps during a process of forming an integrated circuit device stack 10, in accordance with some embodiments.

FIG. 5 shows the structure shown in FIG. 3 after the plasma treatment 80 of FIG. 4A or the implantation process 81 of FIG. 4B is performed on the structure. After the plasma treatment 80 or the implantation process 81 is performed, a top surface and sidewalls of a substrate 60 of each die 68 are doped with fluorine to form doped regions 82. The doped regions 82 may comprise a first doped region 82A in a top surface of the substrate 60 and second doped regions 82B in sidewalls of the substrate 60. The first doped region 82A may be disposed between the second doped regions 82B. The substrate 60 of each die 68 may be doped such that the first doped region 82A extends vertically from the top surface of the substrate 60 to a depth D1 below the top surface of the substrate 60. The first doped region 82A may overlap the TVs 74, wherein the first doped region 82A is disposed above top surfaces of the TVs 74. In an embodiment, a doping concentration of fluorine in the first doped region 82A decreases in the vertical direction of the arrow X-X described above (e.g., from the top surface of the substrate 60 towards a bottom surface of the substrate 60).

The substrate 60 of each die 68 may be doped such that each second doped region 82B extends laterally from a corresponding sidewall of the substrate 60 into the substrate 60 by a depth D2. Each second doped region 82B is disposed to be between a sidewall of the substrate 60 and a corresponding TV 74, and each of the second doped regions 82B may also extend below the first doped regions 82A. In some embodiments, each of the second doped regions 82B may extend along the entirety of a sidewall of the substrate 60. In some embodiments, each of the second doped regions 82B may extend along only a portion of the sidewall of the substrate 60. For example, each of the second doped regions 82B may extend along a top portion of the sidewall of the substrate 60, while a bottom portion of the sidewall of the substrate 60 is not doped. In addition, a doping concentration of fluorine in each of the second doped regions 82B decreases in the vertical direction of the arrow X-X (e.g., from a top surface of the substrate 60 moving towards a bottom surface of the substrate 60). Further, a doping concentration of fluorine in each of the second doped regions 82B decreases in a lateral direction of arrow Y-Y moving from a corresponding sidewall of the substrate 60 into the substrate 60. Each sidewall of the substrate 60 may comprise a first portion of the sidewall of the substrate 60 that is below the first doped regions 82A. The doping depth D2 of each of the second doped regions 82B decreases in a vertical direction of the arrow X-X from a topmost point of the corresponding first portion of the sidewall to a bottommost point of the second doped regions 82B.

Doping the top surface and the sidewalls of the substrate 60 of each die 68 by performing the plasma treatment 80 or the implantation process 81 to form doped regions 82 results in an increased hydrophobicity at the top surface and the sidewalls of the substrates 60 (e.g., the regions of the substrate 60 having the doped regions 82). Hydrophobicity refers to the ability of a material to be resistant to wetting, and the hydrophobicity of a specific location of the substrates 60 may correspond to a degree to which the location is doped with fluorine. Because the doping concentration of fluorine in each of the second doped regions 82B decreases in a vertical direction from a top surface of the substrate 60 towards a bottom surface of the substrate 60, the hydrophobicity of each sidewall of the substrate 60 likewise decreases in a vertical direction from the top surface of the substrate 60 towards the bottom surface of the substrate 60. As a result, during a subsequent gap-filling process (described in FIG. 6) to fill gaps 67 between dies 68, top portions of the sidewalls of the substrate 60 of each of the adjacent dies 68 have a greater hydrophobicity as compared to bottom portions of the sidewalls of the substrate 60 of each of the dies 68. The top portions of the sidewalls of the substrate 60 of each of the dies 68 are therefore more resistant to the adhesion of a gap-filling material to the top portions of the sidewalls than the bottom portions of the sidewalls. This results in the gap-filling material being more likely to adhere to the bottom portions of the sidewalls in the gaps 67 than the top portions of the sidewalls in the gap 67. This allows each gap 67 to be filled from the bottom-up such that bottom portions of the gap 67 are filled first before top portions of the gap 67 are filled. Furthermore, since the top surface of the substrate 60 of each die 68 has increased hydrophobicity, no residue may accumulate on the top surface of the substrate 60 of each die 68 from the gap-filling process, removing the need for a residue cleaning process. As a result, processing may be simplified, and manufacturing costs may be reduced.

Figure 6:
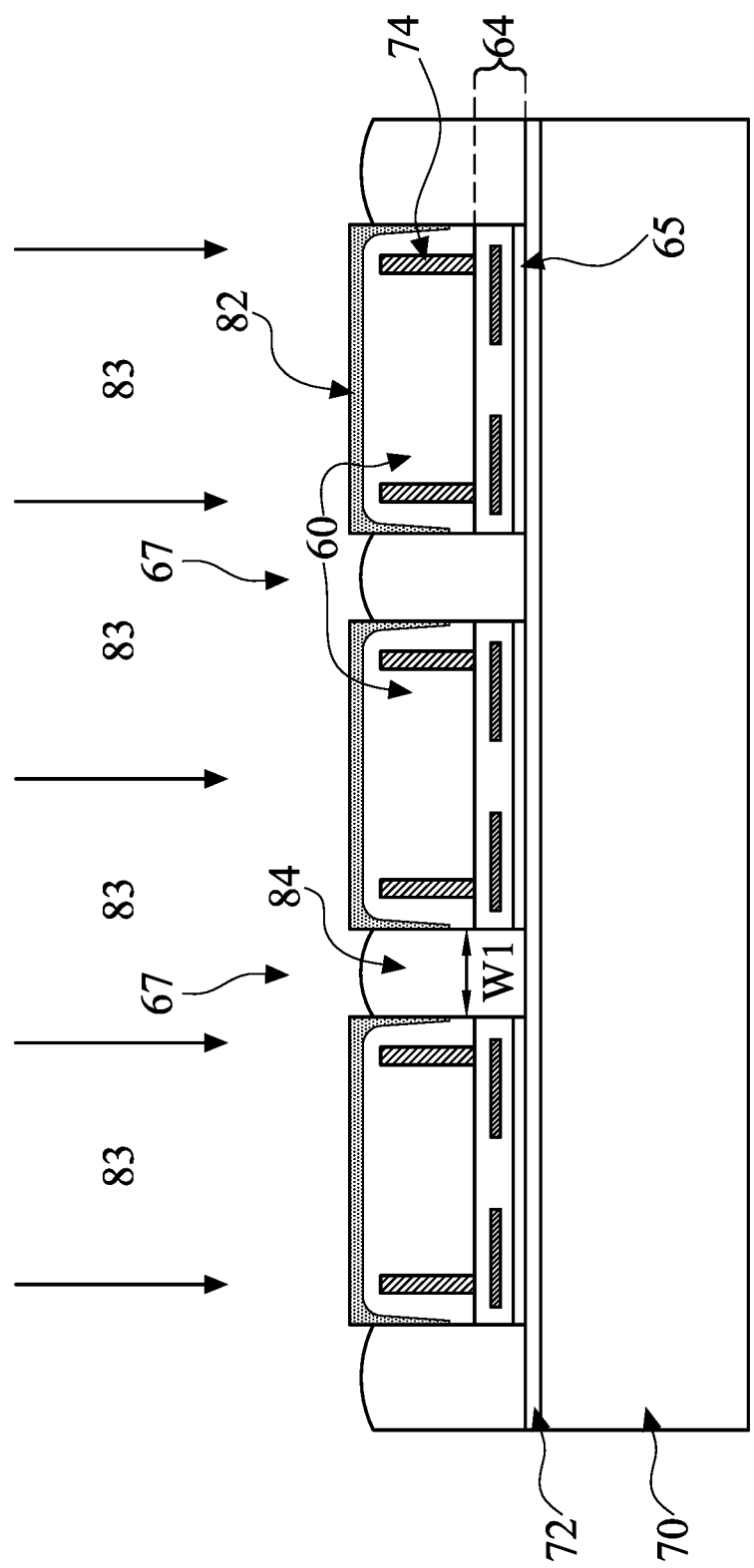

In FIG. 6, a gap-filling process 83 is performed to fill the gaps 67 between sidewalls of adjacent dies 68 with a dielectric material 84, as well as to surround each of the dies 68 with the dielectric material 84. The gap-filling process comprises a coating process, a curing process, and a thermal annealing process that are performed to form a spin-on dielectric material (e.g., the dielectric material 84) over the carrier substrate 70 as shown in FIG. 6. The coating process may include a spin-coating process, or the like. In an embodiment, the spin-coating process is used to introduce a silicon containing liquid precursor to exposed surfaces of the dies 68 (e.g., within the gaps 67), the bonding layer 65, and the bonding layer 72. The spin-on coating process is performed to globally deposit the silicon containing liquid precursor over the carrier substrate 70, which can include filling the gaps 67 between adjacent dies 68. Due to the differences in hydrophobicity of exposed surfaces of the substrates 60 described above, the spin-on coating process may be a bottom-up process such that bottoms of the gaps 67 are filled prior to tops of the gaps 67. In an embodiment, the silicon containing liquid precursor includes perhydro-polysilazane (PHPS). The perhydro-polysilazane compound has a chemical formula $(SiH_2NH)_n$, wherein n is a positive integer. The perhydro-polysilazane compound contains Si—N bonds as a repeating unit and is a silicon-containing polymer consisting of Si, N, and H. The perhydro-polysilazane compound has a linear structure, chain structure, cross-linked structure, or a cyclic structure in a molecule. After the coating process, the silicon containing liquid precursor may fill the gaps 67 partially (e.g., a topmost point of the silicon containing liquid precursor is below topmost surfaces of the dies 68). A top surface of the silicon containing liquid precursor in the gap 67 may have a curved (e.g., convex) surface as a result of the hydrophobicity of the top portions of sidewalls of the dies 68.

Advantages can be achieved by doping the top surface and the sidewalls of the substrate 60 of each die 68 with fluorine dopants by performing the plasma treatment 80 or the implantation process 81 to form the doped region 82. This results in an increased hydrophobicity of the top surface and the sidewalls of the substrate 60 of each die 68. Because the doping concentration of fluorine in each of the second doped regions 82B decreases in a vertical direction from a top surface of the substrate 60 towards a bottom surface of the substrate 60, the hydrophobicity of each sidewall of the substrate 60 likewise decreases in the vertical direction from the top surface of the substrate 60 towards the bottom surface of the substrate 60. The coating process of the gap-filling process 83 is then performed to fill the gaps 67 between sidewalls of adjacent dies 68 with the silicon containing liquid precursor of the dielectric material 84. These advantages include top portions of the sidewalls of the substrate 60 of each of the adjacent dies 68 being more resistant to the adhesion of the silicon containing liquid precursor than bottom portions of the sidewalls. This is because the top portions of the sidewalls of the substrate 60 of each of the dies 68 have a greater hydrophobicity as compared to the bottom portions of the sidewalls of the substrate 60 of each of the dies 68. This results in the silicon containing liquid precursor being more likely to adhere to bottom portions of the sidewalls in the gaps 67 than top portions of the sidewalls in the gaps 67. This allows each gap 67 to be filled from the bottom-up, where bottom portions of the gap 67 are filled first before top portions of the gap 67 are filled. Therefore, it is possible to fill gaps 67 having larger depths (e.g., having depths in a range from 100 μm to 500 μm) with the silicon containing liquid precursor of the dielectric material 84 without the formation of large voids within the silicon containing liquid precursor or the subsequently formed dielectric material 84. This results in improved device reliability and device performance.

In addition, the bottom-up filling of the gaps 67 with the silicon containing liquid precursor also results in a reduced surface roughness of the subsequently formed dielectric material 84, allowing the surface roughness of the dielectric material 84 to be measured by a 10 Angstrom stylus (e.g., the arithmetic average roughness (Ra) of the dielectric material 84 is less than or equal to 10 Angstrom). The reduced surface roughness allows the dielectric material 84 to form a better bonding interface to bond with other subsequently formed layers, components, or structures. As a result, device reliability is improved. Further, because of the hydrophobicity of the top surfaces of each substrate 60 of the dies 68, after the coating process of the gap-filling process 83 is performed, no residue accumulates on the top surfaces of the dies 68, removing the need for a cleaning process after the gap-filling process 83 is performed.

As the perhydro-polysilazane compound includes a silicon-containing polymer consisting of Si, N, and H, the silicon containing liquid precursor of the dielectric material 84 that is formed over the carrier substrate 70 and in the gaps 67 is a silicon and nitrogen containing material, and is converted into a silicon and oxygen containing material by oxidation during a subsequently performed thermal treating process that is described below.

After the coating process of the gap-filling process 83 is performed, the curing process may then be performed. The curing process is performed to removes moisture or solvent from the silicon containing liquid precursor of the dielectric material 84, so as to form a solid phase of the dielectric material 84. In some embodiments, the curing process may be performed using a hot plate, an oven, a heated chamber, or the like. A UV light source may provide radiation, generating heat energy needed to remove the moisture or solvent from the silicon containing liquid precursor of the dielectric material 84. In some embodiments, the curing process is a UV thermal curing process and is performed by exposing the substrate under a UV thermal energy with or without a curing gas. The curing process may be performed at a temperature in a in a range from 20° C. to 400° C. During the curing process, the Si—N and Si—H bonds of the perhydro-polysilazane compound decompose to form silicon nitride.

After the curing process of the gap-filling process 83 is performed, a thermal annealing process is performed to anneal the dielectric material 84, and convert it from silicon nitride to silicon oxide. The thermal energy provided from the thermal annealing process may also densify and enhance the bonding structures of the dielectric material 84. During the thermal annealing process, an annealing gas comprising at least one oxygen containing gas is supplied. The oxygen from the oxygen containing gas reacts with the silicon atoms and converts the silicon nitride into silicon oxide. The thermal energy provided from the thermal annealing process breaks the Si—N bonds, allowing the oxygen atoms to be bonded and attached to the silicon atoms, forming the annealed dielectric material 84 that comprises silicon oxide. Thus, the temperature during the thermal annealing process is often pre-determined so as to provide thermal energy that is sufficient to convert the Si—N bonds into Si—O bonds in order to form the desired silicon oxide material. During the thermal annealing process, the oxygen containing gas that is supplied may include $O_2$, $O_3$, steam ($H_2O$), $H_2O_2$, air, $CO_2$, CO, the like, or a combination thereof. During the thermal annealing process, the process temperature may be greater than 350° C., such as in a range from 400° C. to 1200° C.

Figure 7:
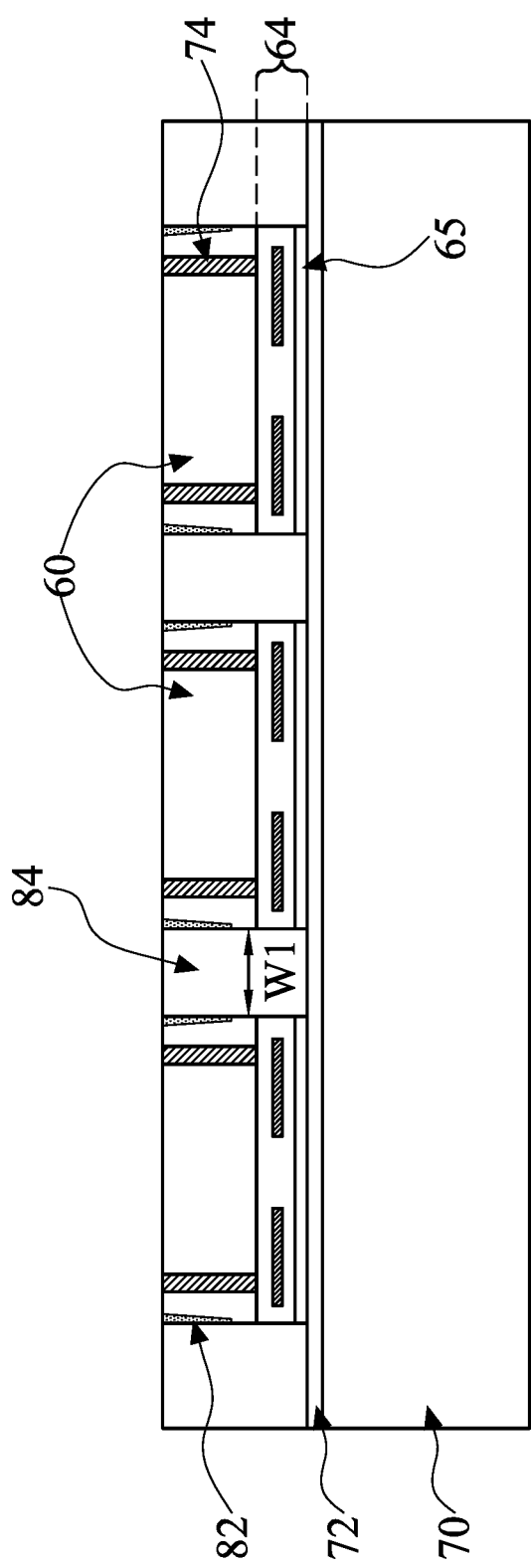

In FIG. 7, a planarization step, such as a grinding process, a CMP process, or the like, may be performed to thin down the dies 68 and level the top surface of the dielectric material 84. After the planarization process, top surfaces of the dies 68 (e.g., the substrate 60 of each die 68) and top surfaces of the dielectric material 84 are substantially coplanar. The planarization process may remove an entirety of the first doped region 82A of each die 68. In addition, top portions of the second doped regions 82B of each die 68 may also be removed during the planarization step. Therefore, after the planarization step is performed, a top surface of a central region of each die 68 that overlaps corresponding TVs 74 is not doped. However, bottom portions of the second doped regions 82B remain on sidewalls of the substrate 60 of each die 68.

Figure 8:
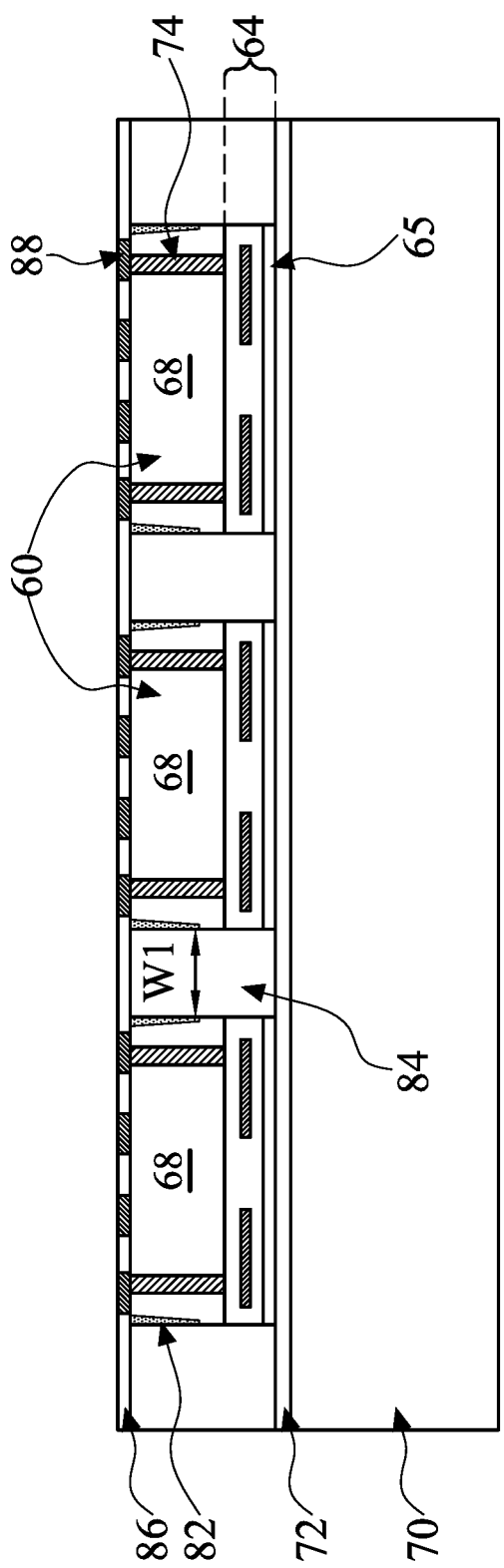

FIG. 8 shows that the planarization step described previously in FIG. 7 may be continued to further thin down the dies 68 and the dielectric material 84 until top surfaces of the TVs 74 are exposed, and top surfaces of the dies 68 (e.g., the substrate 60 of each die 68), top surfaces of the dielectric material 84, and the top surfaces of the TVS 74 are substantially coplanar.

Further referring to FIG. 8, conductive connectors 88 are formed on the top surfaces of the dies 68 and the top surfaces of the TVs 74. The conductive connectors 88 can be formed of a metal, such as copper, aluminum, or the like, and can be formed by, for example, plating, or the like. The conductive connectors 88 may be conductive pillars, pads, or the like, to which external connections are made. The conductive connectors 88 may be electrically connected to the TVs 74 and the interconnect structure 64.

A dielectric layer 86 is then formed to laterally encapsulate the conductive connectors 88. The dielectric layer 86 may be an oxide, a nitride, a carbide, a polymer, the like, or a combination thereof. The dielectric layer 86 may be formed, for example, by spin coating, lamination, chemical vapor deposition (CVD), or the like. Initially, the dielectric layer 86 may bury the conductive connectors 88, such that the top surface of the dielectric layer 86 is above the top surfaces of the conductive connectors 88. The conductive connectors 88 may be exposed through the dielectric layer 86 by a removal process that can be applied to the various layers to remove excess materials over the conductive connectors 88. The removal process may be a planarization process such as a chemical mechanical polish (CMP), an etch-back, combinations thereof, or the like. After the planarization process, top surfaces of the conductive connectors 88 and the dielectric layer 86 are coplanar (within process variations).

Figure 9:
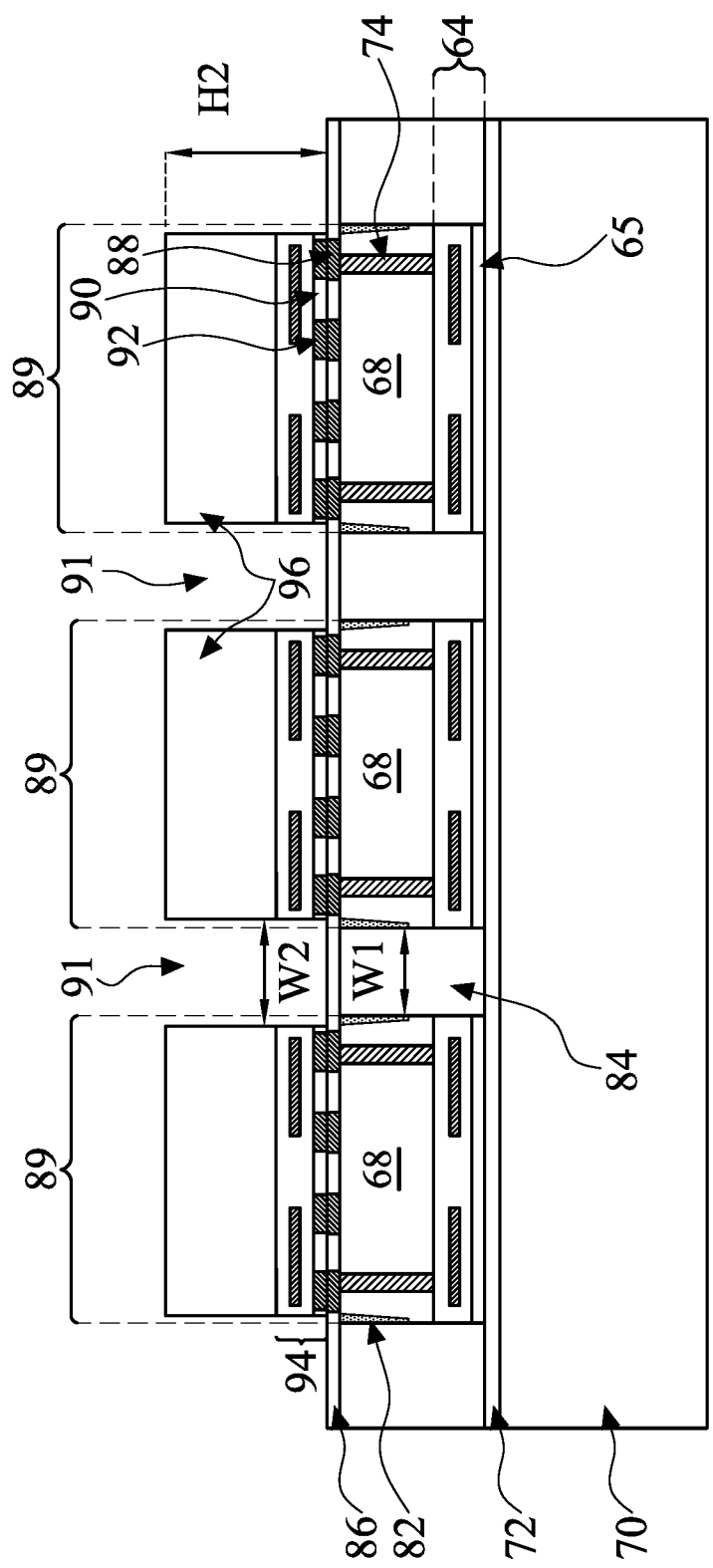

In FIG. 9, dies 89 are bonded to corresponding ones of the dies 68. The dies 89 may be subsequently referred to as top dies, and the dies 68 may be subsequently referred to as bottom dies. The dies 89 may be similar to the dies 68 and may be formed using like processes and like materials as were previously described for the dies 68 in FIGS. 1-2. For example, each die 89 may comprise a substrate 96 and an interconnect structure 94 that comprise like materials and are formed using like processes as the substrate 60 and the interconnect structure 64, respectively. In addition, the dies 89 may or may not comprise through-vias (TVs) similar to the TVs 74 of the dies 68. Devices, such as transistors, capacitors, resistors, diodes, and the like, may be formed in and/or on an active surface of the substrate 96 of each die 89. In addition, each die 89 may comprise conductive connectors 92, and a dielectric layer 90 which may be in and/or on the interconnect structure 94 of the die 89. The conductive connectors 92 may be formed using like processes and like materials as the conductive connectors 88. The dielectric layer 90 may be formed using like processes and like materials as the dielectric layer 86.

In some embodiments, each die 68 and a corresponding die 89 are bonded such that the active surface of the die 89 and a back-side of the die 68 are facing each other (e.g., are "face-to-back" bonded). Each die 68 is bonded to a corresponding die 89, for example, using a hybrid bonding process, such that the dielectric layer 90 of the interconnect structure 94 is bonded to the dielectric layer 86 through dielectric-to-dielectric bonding, without using any adhesive material (e.g., die attach film), and the conductive connectors 92 are bonded to the conductive connectors 88 through metal-to-metal bonding, without using any eutectic material (e.g., solder). The bonding may include a pre-bonding and an annealing. During the pre-bonding, a small pressing force may be applied to press the dies 89 against the dies 68. The pre-bonding is performed at a low temperature, such as room temperature, such as a temperature in the range of 15° C. to 30° C., and after the pre-bonding, the dielectric layer 90 and the dielectric layer 86 are bonded to each other. The bonding strength is then improved in a subsequent annealing step, in which the dielectric layer 90 and the dielectric layer 86 are annealed at a high temperature, such as a temperature in the range of 140° C. to 500° C. After the annealing, bonds, such as fusion bonds, are formed bonding the dielectric layer 90 and the dielectric layer 86. For example, the bonds can be covalent bonds between the material of the dielectric layer 90 and the material of the dielectric layer 86. Further, the material of the conductive connectors 92 and the conductive connectors 88 may inter-diffuse and bond together as a result of the annealing process. The conductive connectors 92 and the conductive connectors 88 are connected to each other with a one-to-one correspondence. The conductive connectors 92 and the conductive connectors 88 may be in physical contact after the pre-bonding, or may expand to be brought into physical contact during the annealing. Further, during the annealing, the material of the conductive connectors 92 and the conductive connectors 88 (e.g., copper) intermingles, so that metal-to-metal bonds are also formed. Hence, the resulting bonds between the dies 68 and the dies 89 are hybrid bonds that include both dielectric-to-dielectric bonds and metal-to-metal bonds.

Thus, each die 68 and a corresponding die 89 are electrically connected. For example, the interconnect structure 94 of each die 89 may be electrically connected to the interconnect structure 64 of a corresponding die 68 through the TVs 74.

After the bonding of the dies 89 to corresponding ones of the dies 68, gaps 91 may be disposed between adjacent dies 89. For example, a width W2 of a gap 91 between a first sidewall of a first die 89 and a second sidewall of an adjacent die 89 is in a range from 10 μm to 200 μm. In an embodiment, the width W2 may be different than the width W1. In an embodiment, the width W2 may be smaller or larger than the width W1. In an embodiment, a height H2 of each die 89 is in a range from 100 μm to 500 μm. In an embodiment, each gap 91 may have a depth that is in a range from 100 μm to 500 μm.

Figure 10:
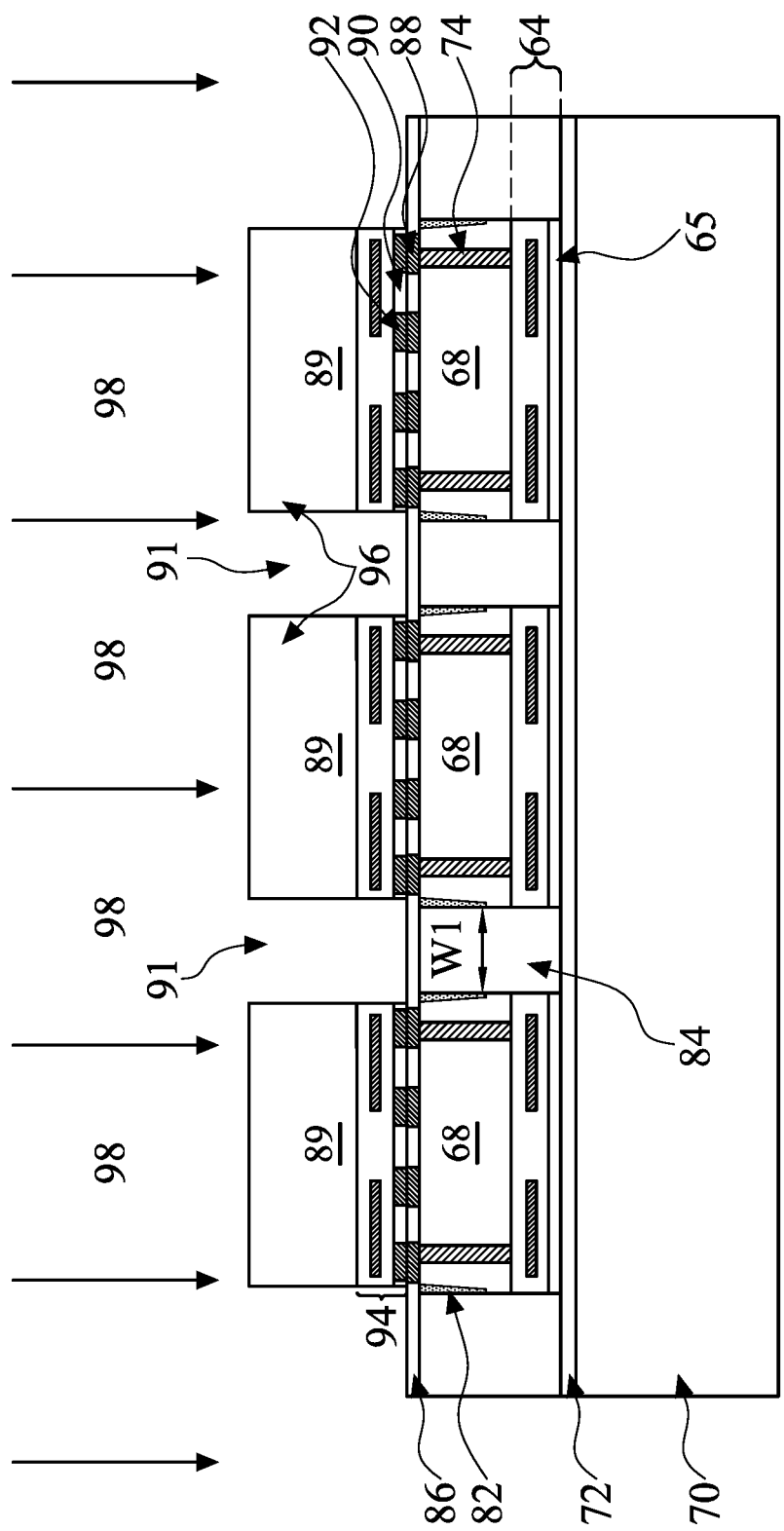

In FIG. 10, a process 98 is performed on the structure shown in FIG. 9. The process 98 may be a plasma treatment similar to the plasma treatment 80 described previously in FIG. 4A, or the process 98 may be an implantation process similar to the implantation process 81 described previously in FIG. 4B.

Figure 11:
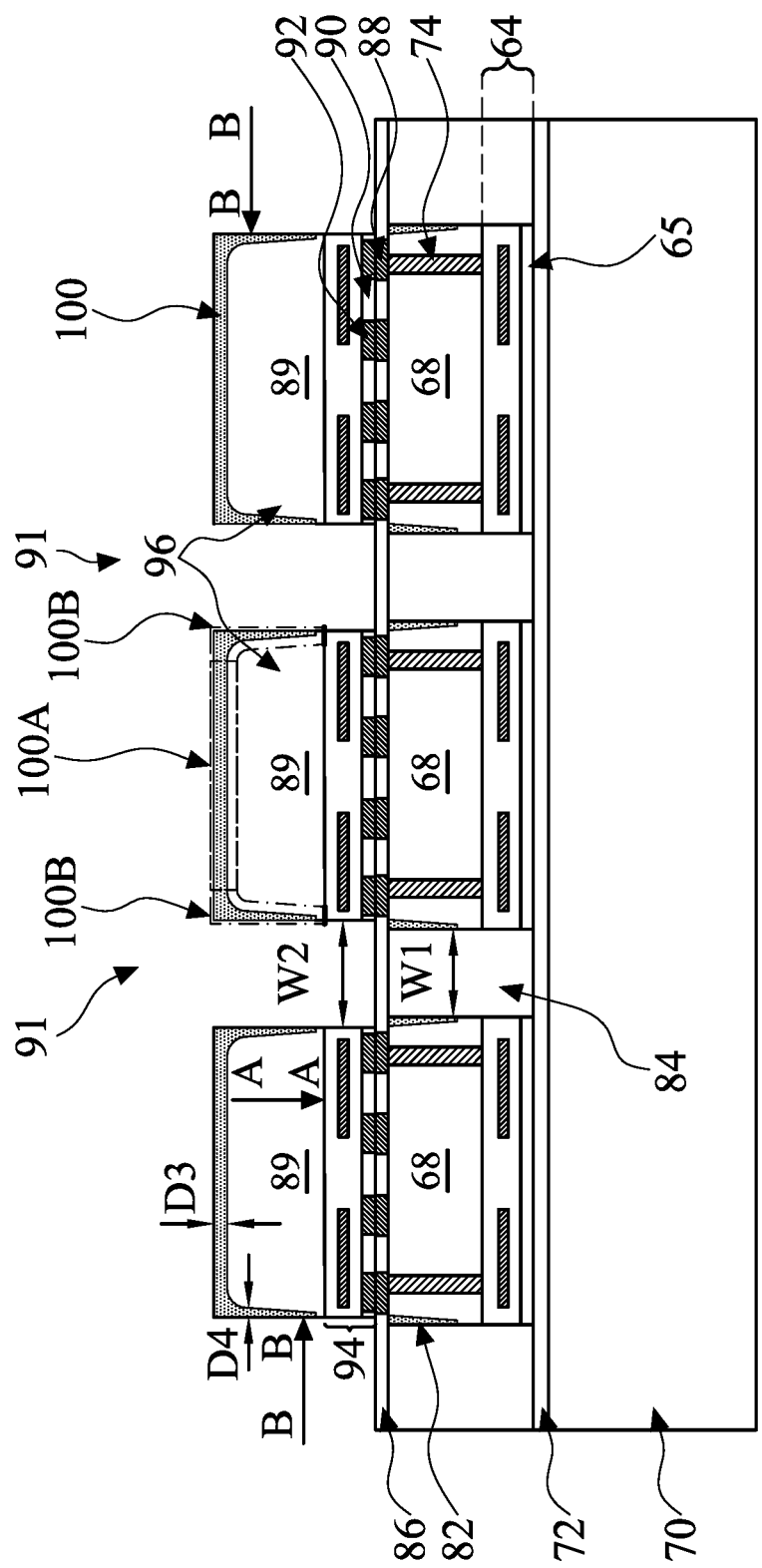

FIG. 11 shows the structure shown in FIG. 10 after the process 98 (e.g., the plasma treatment or the implantation process) is performed on the structure. After the process 98 is performed, a top surface and sidewalls of a substrate 96 of each die 89 are doped with fluorine to form doped regions 100. The doped regions 100 may comprise a first doped region 100A in a top surface of the substrate 96 and second doped regions 100B in sidewalls of the substrate 96. The first doped region 100A may be disposed between the second doped regions 100B. The substrate 96 of each die 89 may be doped such that the first doped region 100A extends vertically from the top surface of the substrate 96 to a depth D3 below the top surface of the substrate 96. In an embodiment, a doping concentration of fluorine in the first doped region 100A decreases in the vertical direction A-A from the top surface of the substrate 96 towards a bottom surface of the substrate 96.

The substrate 96 of each die 89 may be doped such that each second doped region 100B extends laterally from a corresponding sidewall of the substrate 96 into the substrate 96 by a depth D4. Each second doped region 100B is disposed to be between a sidewall of the substrate 96 and a corresponding TV (if present), and each of the second doped regions 100B may also extend below the first doped regions 100A. Each of the second doped regions 100B may extend along the entirety of a sidewall of the substrate 96. In an embodiment, each of the second doped regions 100B may extend along only a portion of the sidewall of the substrate 96. For example, each of the second doped regions 100B may extend along a top portion of the sidewall of the substrate 96, while a bottom portion of the sidewall of the substrate 96 is not doped. In addition, a doping concentration of fluorine in each of the second doped regions 100B decreases in the vertical direction of the arrow A-A (e.g., from a top surface of the substrate 96 moving towards a bottom surface of the substrate 96). Further, a doping concentration of fluorine in each of the second doped regions 100B decreases in a lateral direction of arrow B-B moving from a corresponding sidewall of the substrate 96 into the substrate 96. Each sidewall of the substrate 96 may comprise a first portion of the sidewall of the substrate 96 that is below the first doped region 100A. The doping depth D4 of each of the second doped regions 100B decreases in the vertical direction of the arrow B-B from a topmost point of the corresponding first portion of the sidewall to a bottommost point of the second doped region 100B.

Doping the top surface and the sidewalls of the substrate 96 of each die 89 by performing the process 98 to form doped regions 100 results in an increased hydrophobicity at the top surface and the sidewalls of the substrate 96. Because the doping concentration of fluorine in each of the second doped regions 100B decreases in a vertical direction from a top surface of the substrate 96 towards a bottom surface of the substrate 96, the hydrophobicity of each sidewall of the substrate 96 decreases in a vertical direction from the top surface of the substrate 96 towards the bottom surface of the substrate 96. As a result, during a subsequent gap-filling process (described in FIG. 12) to fill gaps 91 between dies 89, top portions of the sidewalls of the substrate 96 of each of the adjacent dies 89 have a greater hydrophobicity as compared to bottom portions of the sidewalls of the substrate 96 of each of the dies 89. The top portions of the sidewalls of the substrate 96 of each of the dies 89 are therefore more resistant to the adhesion of a gap-filling material to the top portions of the sidewalls than the bottom portions of the sidewalls. This results in the gap-filling material being more likely to adhere to the bottom portions of the sidewalls in the gaps 91 than the top portions of the sidewalls in the gap 91. This allows each gap 91 to be filled from the bottom-up, where bottom portions of the gap 91 are filled first before top portions of the gap 91 are filled. Furthermore, since the top surface of the substrate 96 of each die 89 has increased hydrophobicity, no residue may accumulate on the top surface of the substrate 96 of each die 89 from the gap-filling process, removing the need for a residue cleaning process. As a result, processing may be simplified, and manufacturing costs may be reduced.

Figure 12:
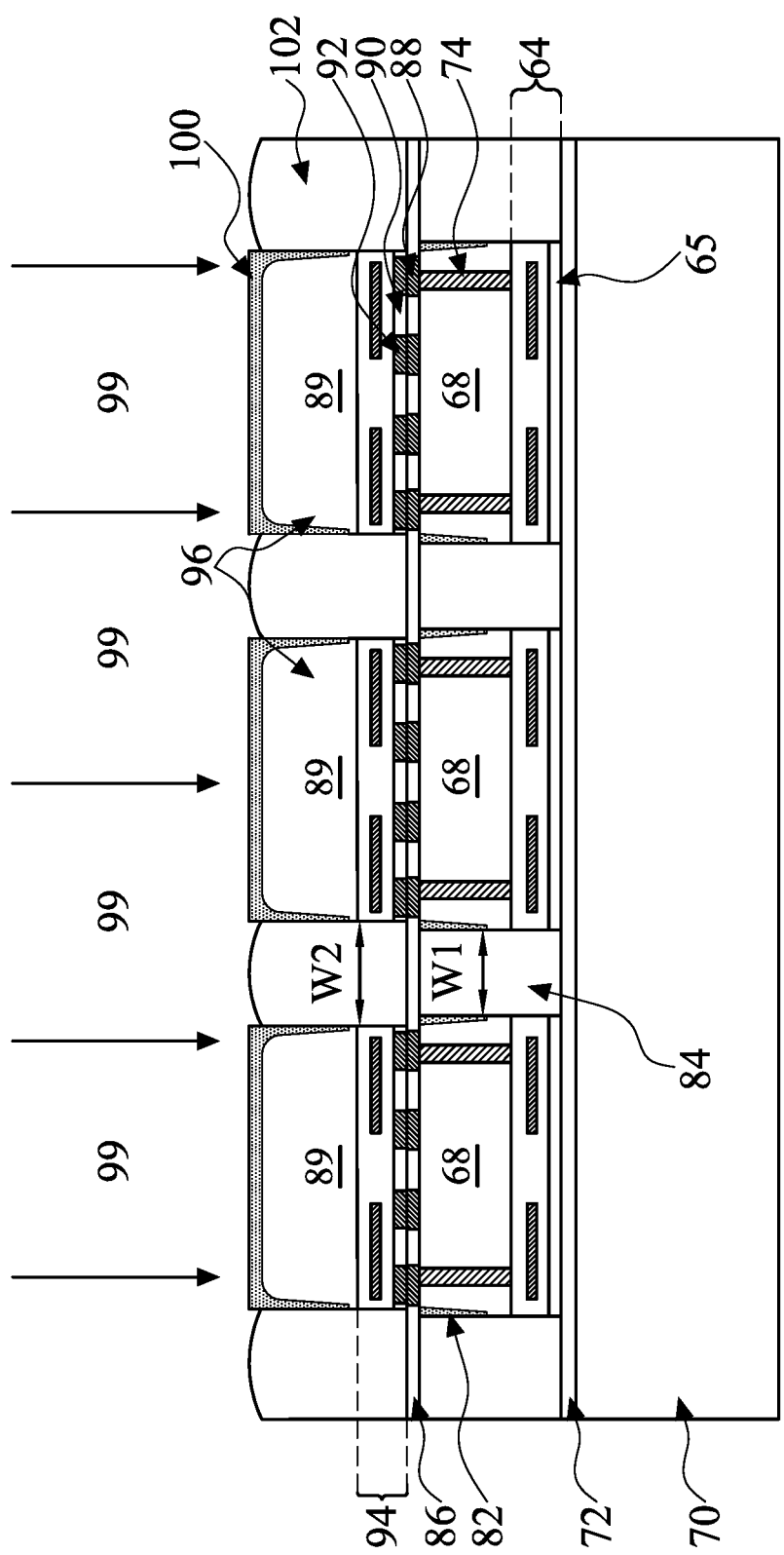

In FIG. 12, a gap-filling process 99 is performed to fill the gaps 91 between sidewalls of adjacent dies 89 with a dielectric material 102, as well as to surround each of the dies 89 with the dielectric material 102. The gap-filling process 99 may be similar to the gap-filling process 83 described previously in FIG. 6, and may use like processes and like materials to fill the gaps 91 between the sidewalls of the adjacent dies 89 with the dielectric material 102. For example, the gap-filling process 99 comprises a coating process, a curing process, and a thermal annealing process that are performed to form a spin-on dielectric material (e.g., the dielectric material 102) over the dielectric material 84 and the carrier substrate 70. In an embodiment where the width W2 is larger than the width W1, the dielectric material 102 is also formed to overlap portions of the dies 68. The coating process, the curing process, and the thermal annealing processes are similar to the coating process, the curing process, and the thermal annealing processes described previously for the gap-filling process 83 in FIG. 6.

Advantages can be achieved by doping the top surface and the sidewalls of the substrate 96 of each die 89 with fluorine dopants by performing the process 98 to form the doped region 100. This results in an increased hydrophobicity of the top surface and the sidewalls of the substrate 96 of each die 89. Because the doping concentration of fluorine in each of the second doped regions 100B decreases in a vertical direction from a top surface of the substrate 96 towards a bottom surface of the substrate 96, the hydrophobicity of each sidewall of the substrate 96 likewise decreases in the vertical direction from the top surface of the substrate 96 towards the bottom surface of the substrate 96. The coating process of the gap-filling process 99 is then performed to fill the gaps 91 between sidewalls of adjacent dies 89 with the silicon containing liquid precursor of the dielectric material 102. These advantages include top portions of the sidewalls of the substrate 96 of each of the adjacent dies 89 being more resistant to the adhesion of the silicon containing liquid precursor than bottom portions of the sidewalls. This is because the top portions of the sidewalls of the substrate 96 of each of the dies 89 have a greater hydrophobicity as compared to the bottom portions of the sidewalls of the substrate 96 of each of the dies 89. This results in the silicon containing liquid precursor being more likely to adhere to bottom portions of the sidewalls in the gaps 91 than top portions of the sidewalls in the gaps 91. This allows each gap 91 to be filled from the bottom-up, where bottom portions of the gap 91 are filled first before top portions of the gap 91 are filled. Therefore, it is possible to fill gaps 91 having larger depths (e.g., having depths in a range from 100 µm to 500 µm) with the silicon containing liquid precursor of the dielectric material 102 without the formation of large voids within the silicon containing liquid precursor or the subsequently formed dielectric material 102. This results in improved device reliability and device performance.

In addition, the bottom-up filling of the gaps 91 with the silicon containing liquid precursor also results in a reduced surface roughness of the subsequently formed dielectric material 102, allowing the surface roughness of the dielectric material 102 to be measured by a 10 Angstrom stylus (e.g., the arithmetic average roughness (Ra) of the dielectric material 102 is less than or equal to 10 Angstrom). The reduced surface roughness allows the dielectric material 102 to form a better bonding interface to bond with other subsequently formed layers, components, or structures. As a result, device reliability is improved. Further, because of the hydrophobicity of the top surfaces of each substrate 96 of the dies 89, after the coating process of the gap-filling process 99 is performed, no residue accumulates on the top surfaces of the dies 89, removing the need for a cleaning process after the gap-filling process 99 is performed.

After the coating process, the curing process, and the thermal annealing process of the gap-filling process 99 is performed, the dielectric material 102 that comprises silicon oxide is disposed between sidewalls of adjacent dies 89 (e.g., within the gaps 91). In addition, the dielectric material 102 surrounds each of the dies 89.

Figure 13:
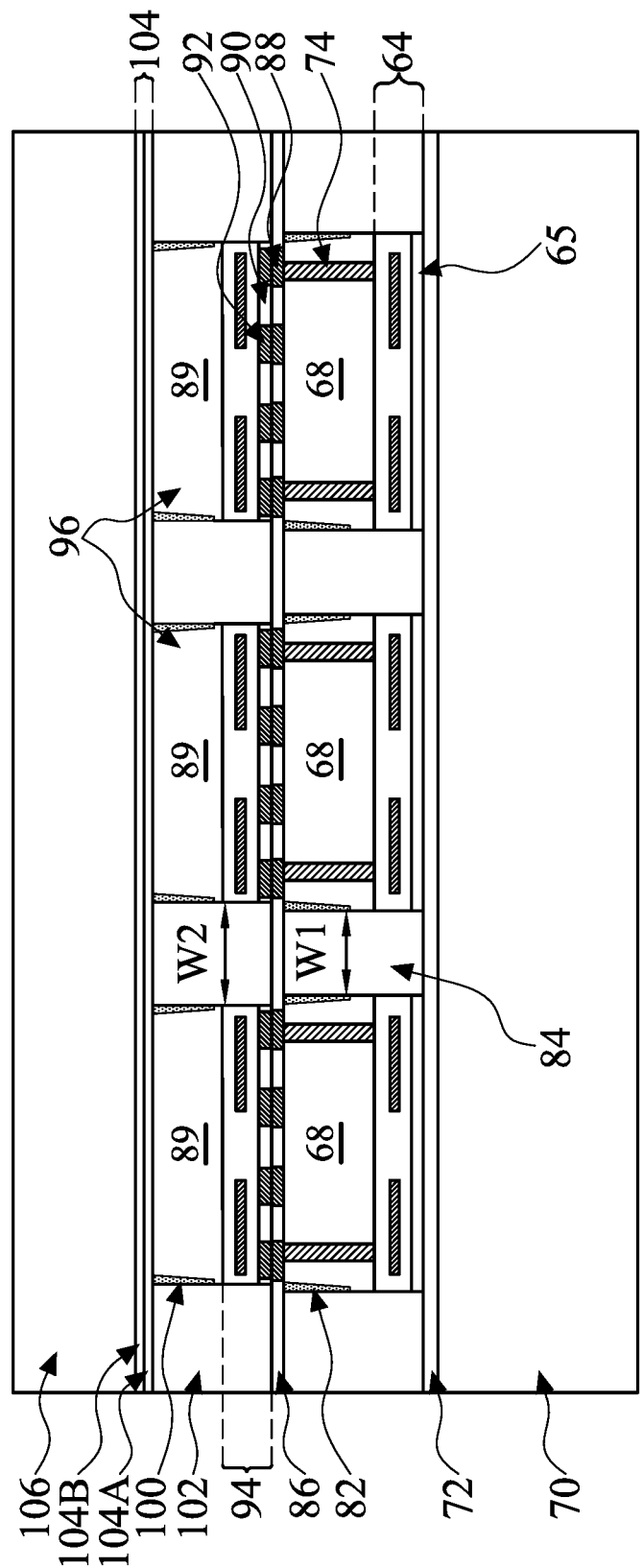

In FIG. 13, a planarization step, such as a grinding process, a CMP process, or the like, may be performed to thin down the dies 89 and level the top surface of the dielectric material 102. After the planarization process, top surfaces of the dies 89 (e.g., the substrate 96 of each die 89) and top surfaces of the dielectric material 102 are substantially coplanar. The planarization process may remove an entirety of the first doped region 100A of each die 89. In addition, top portions of the second doped regions 100B of each die 89 may also be removed during the planarization step. Therefore, after the planarization step is performed, a top surface of a central region of each die 89 is not doped. However, bottom portions of the second doped regions 100B remain on sidewalls of the substrate 96 of each die 89.

FIG. 13 also shows that after the planarization step, a carrier substrate 106 is bonded to the top surfaces of the dies 89 and the dielectric material 102. The carrier substrate 106 may be a semiconductor substrate (e.g., a silicon substrate or wafer), a glass carrier substrate, a ceramic carrier substrate, or the like. The carrier substrate 106 is bonded to the top surfaces of the dies 89 and the dielectric material 102 using a suitable technique such as dielectric-to-dielectric bonding, or the like. For example, in various embodiments, the top surfaces of the dies 89 and the dielectric material 102 may be bonded to a surface of the carrier substrate 106 using dielectric-to-dielectric bonding by use of a bonding layer 104A on the top surfaces of the dies 89 and the dielectric material 102, and a bonding layer 104B on the surface of the carrier substrate 106. In some embodiments, the bonding layer 104A and bonding layer 104B may each comprise silicon oxide formed on the top surfaces of the dies 89 and the dielectric material 102, and the surface of the carrier substrate 106, respectively by a deposition process, such as chemical vapor deposition (CVD), physical vapor deposition (PVD), or the like. In other embodiments, the bonding layer 104B may be formed by the thermal oxidation of a silicon surface on the carrier substrate 106.

Prior to bonding, at least one of the bonding layers 104A or 104B may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to the bonding layers 104A and/or bonding layer 104B. The carrier substrate 106 is then aligned and pressed against the top surfaces of the dies 89 and the dielectric material 102 to initiate a pre-bonding of the dies 89 and the dielectric material 102, to the carrier substrate 106. The pre-bonding may be performed at room temperature (between about 20 degrees and about 25 degrees). After the pre-bonding, the dies 89 and the dielectric material 102, and the carrier substrate 106 are bonded to each other. The bonding process may be strengthened by a subsequent annealing step. For example, this may be done by heating the dies 89, the dielectric material 102, and the carrier substrate 106 to a temperature of about 170 degrees for about 1 hour.

Figure 14:
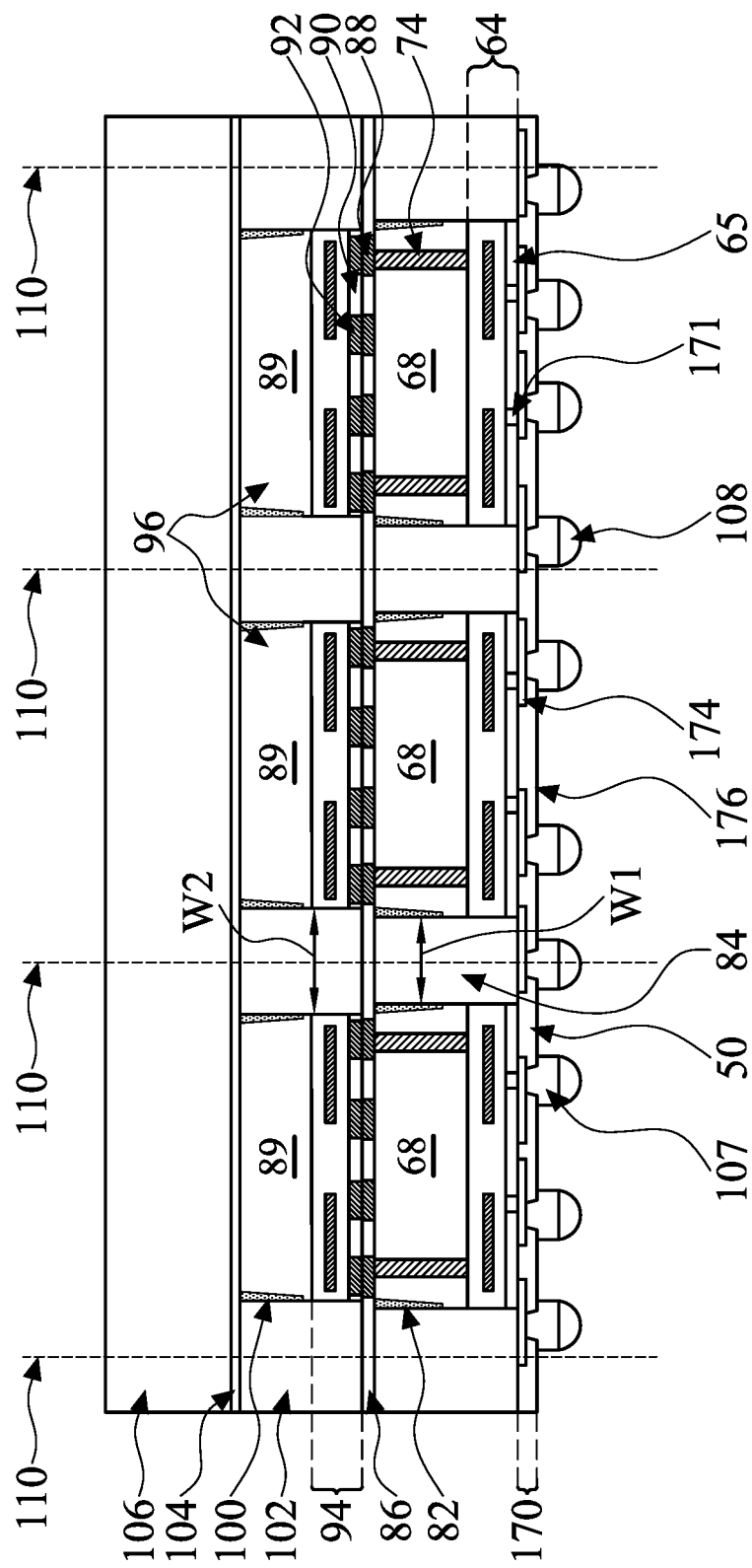

In FIG. 14, following the attachment of the carrier substrate 106 to the top surfaces of the dies 89 and the dielectric material 102, a planarization process may be performed to remove the carrier substrate 70. In some embodiments, the planarization process may be a CMP planarization process, an etch back process, combinations thereof, or the like. However any suitable planarization process may be utilized. Further, in accordance with some embodiments, the planarization process further removes the first bonding layer 72. In addition, the planarization process may remove portions of the bonding layer 65 and the dielectric material 84. In an embodiment, after the planarization process, bottom surfaces of the bonding layer 65 and the dielectric material 84 are level.

FIG. 14 further illustrates a formation of a redistribution structure 170 over bottom surfaces of the bonding layer 65 and the dielectric material 84. FIG. 14 additionally illustrates die connectors 171 formed through the bonding layer 65 which allows for the physical and electrical coupling of the redistribution structure 170 to the dies 89 and the dies 68.

In an embodiment, openings (not separately illustrated) are formed through the bonding layer 65 exposing the metallization patterns within the interconnect structure 64. The die connectors 171, such as conductive pillars (for example, formed of a metal such as copper), extend through the openings in the bonding layer 65 and are physically and electrically coupled to the metallization patterns within the interconnect structure 64. The die connectors 171 may be formed by, for example, plating, or the like.

Further, in an embodiment, the redistribution structure 170 includes a redistribution dielectric layer 176, and a redistribution metallization pattern 174. The redistribution metallization pattern 174 may also be referred to as a redistribution layer or a redistribution line. The redistribution structure 170 is shown as an example having one layer of metallization patterns. More dielectric layers and metallization patterns may be formed in the redistribution structure 170. If more dielectric layers and metallization patterns are to be formed, steps and processes discussed below may be repeated.

In an embodiment, the redistribution metallization pattern 174 includes conductive elements that physically and electrically couple to the die connectors 171. As an example to form the redistribution metallization pattern 174, a seed layer is formed over the bottom surfaces of the bonding layer 65 and the dielectric material 84 (e.g., over the die connectors 171). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the redistribution metallization pattern 174. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the redistribution metallization pattern 174. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In an embodiment, the redistribution dielectric layer 176 is deposited over the redistribution metallization pattern 174 and over the over the bottom surfaces of the bonding layer 65 and the dielectric material 84. In some embodiments, the redistribution dielectric layer 176 is formed of a photo-sensitive material such as PBO, polyimide, BCB, or the like, which may be patterned using a lithography mask. The redistribution dielectric layer 176 may be formed by spin coating, lamination, CVD, the like, or a combination thereof. The redistribution dielectric layer 176 is then patterned. The patterning forms openings exposing portions of the redistribution metallization patterns 176. The patterning may be by an acceptable process, such as by exposing and developing the redistribution dielectric layer 176 to light when the redistribution dielectric layer 176 is a photo-sensitive material or by etching using, for example, an anisotropic etch.

Following the patterning of the redistribution dielectric layer 176, under bump metallizations (UBMs) 107 are formed for external connection to the redistribution structure 170 and the overlying dies 68 and the dies 89. The UBMs 107 have bump portions on and extending along the major surface of the redistribution dielectric layer 176, and have via portions extending through the redistribution dielectric layer 176 to physically and electrically couple the redistribution metallization pattern 174. As a result, the UBMs 107 are electrically coupled to the overlying dies 68 and the dies 89. The UBMs 107 may be formed of the same material as the redistribution metallization pattern 174. In some embodiments, the UBMs 107 have a different size than the redistribution metallization pattern 174.

Further, in an embodiment, conductive connectors 108 are formed on the UBMs 107. The conductive connectors 108 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 108 may include a conductive material such as solder, copper, aluminum, gold, nickel, silver, palladium, tin, the like, or a combination thereof. In some embodiments, the conductive connectors 108 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 108 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 15:
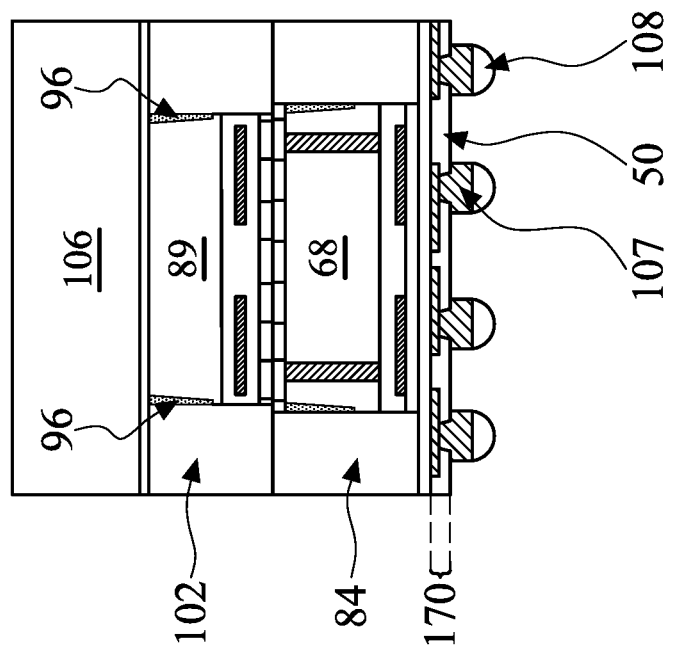

In FIG. 15, a singulation process is performed by sawing along scribe lines 110 that are shown previously in FIG. 14. The singulation process may include a mechanical process such as a sawing process, a cutting process, or the like. In some embodiments, the singulation process may include an etching process, lasering process, mechanical process, and/or combinations thereof. The singulation process singulates the structure shown in FIG. 14 into a plurality of integrated circuit device stacks 10. FIG. 15 shows one of the resulting, singulated integrated circuit device stacks 10. The singulated integrated circuit device stack 10 may be further processed and integrated as a component of a semiconductor package as described in further detail below.

Figure 16:
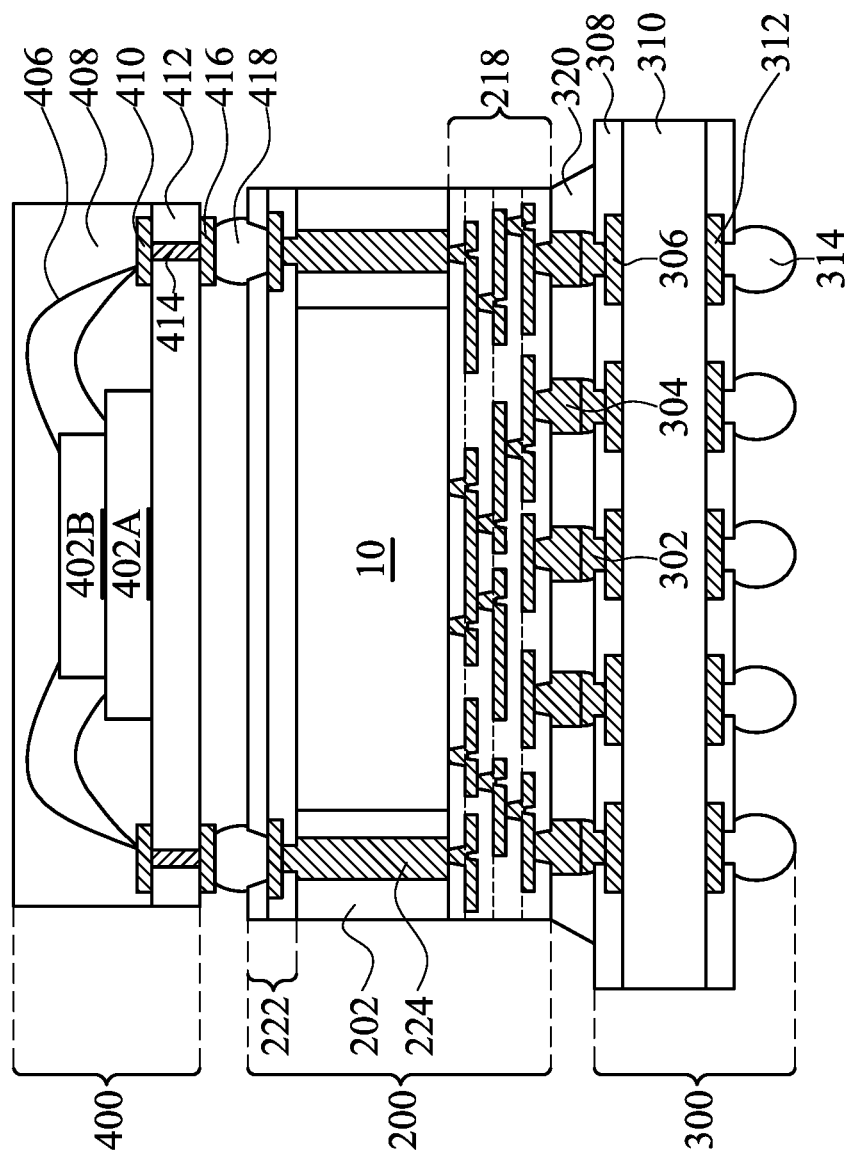
FIG. 16 illustrates a cross-sectional view of a package 20 in accordance with an alternate embodiment.

FIG. 16 illustrates a cross-sectional view of a package 20 incorporating integrated circuit device stack 10 as a package component, in accordance with some embodiments. Unless specified otherwise, like reference numerals in this embodiment (and subsequently discussed embodiments) represent like components in the embodiment shown in FIGS. 1 through 15 formed by like processes. Accordingly, the process steps and applicable materials may not be repeated herein. An integrated circuit device stack 10 described in FIGS. 1 through 15 is further packaged to form the package 20. The package 20 may also be referred to as an integrated fan-out (InFO) package. Even though only one integrated circuit device stack 10 is shown in FIG. 16, the package 20 may comprise more than one integrated circuit device stack 10.

The package 20 comprises a first package component 200 that includes the integrated circuit device stack 10 disposed over and electrically connected to a front-side redistribution structure 218. The integrated circuit device stack 10 is electrically connected to the front-side redistribution structure 218 by coupling the conductive connectors 108 (described previously in FIG. 14 but not shown in FIG. 16) to a metallization pattern (e.g., conductive pads) of the front-side redistribution structure 218. The integrated circuit device stack 10 may be encapsulated by an encapsulant 202 (e.g., a molding compound, epoxy, or the like). The front-side redistribution structure 218 includes any number of dielectric layers and any number of metallization patterns. The metallization patterns may also be referred to as redistribution layers or redistribution lines. The first package component 200 may also comprise a back-side redistribution structure 222 and through vias 224 extending through the encapsulant 202, which electrically connect the back-side redistribution structure 222 to the front-side redistribution structure 218. In the embodiment shown, the back-side redistribution structure 222 may comprise one or more dielectric layers, and at least one metallization pattern (sometimes referred to as redistribution layers or redistribution lines).

UBMs 304 may be disposed over and electrically connected to the front-side redistribution structure 218. The UBMS 304 may be made of the same material as the metallization pattern of the front-side redistribution structure 218. Conductive connectors 302 are disposed on and electrically connected to the UBMs 304. The conductive connectors 302 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 302 may include a conductive material such as solder, copper, aluminum, gold, nickel, silver, palladium, tin, the like, or a combination thereof.

A package substrate 300 may be coupled to the first package component 200 using the conductive connectors 302. The package substrate 300 may comprise a printed circuit board (PCB). In an embodiment, the package substrate 300 includes a substrate core 310 and bond pads 306 over the substrate core 310. The substrate core 310 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 310 may be an SOI substrate. Generally, an SOI substrate includes a layer of a semiconductor material such as epitaxial silicon, germanium, silicon germanium, SOI, SGOI, or combinations thereof. The substrate core 310 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 310.

The substrate core 310 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 310 may also include metallization layers and vias (not shown), with the bond pads 306 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 310 is substantially free of active and passive devices.

In some embodiments, the conductive connectors 302 are reflowed to attach the first package component 200 to the bond pads 306. The conductive connectors 302 electrically and/or physically couple the package substrate 300, including metallization layers in the substrate core 310, to the first package component 200. In some embodiments, a solder resist 308 is formed on the substrate core 310. The conductive connectors 302 may be disposed in openings in the solder resist 308 to be electrically and mechanically coupled to the bond pads 306. The solder resist 308 may be used to protect areas of the substrate core 310 from external damage.

The conductive connectors 302 may have an epoxy flux (not shown) formed thereon before they are reflowed with at least some of the epoxy portion of the epoxy flux remaining after the first package component 200 is attached to the package substrate 300. This remaining epoxy portion may act as an underfill to reduce stress and protect the joints resulting from reflowing the conductive connectors 302. In some embodiments, an underfill 320 may be formed between the first package component 200 and the package substrate 300 and surrounding the conductive connectors 302. The underfill 320 may be formed by a capillary flow process after the first package component 200 is attached or may be formed by a suitable deposition method before the first package component 200 is attached.

In an embodiment, the package substrate 300 may comprise bond pads 312 over the substrate core 310. Conductive connectors 314 may be coupled to the bond pads 312 to allow for the electrical coupling of the package substrate 300 to external circuits or devices. The conductive connectors 314 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 314 may include a conductive material such as solder, copper, aluminum, gold, nickel, silver, palladium, tin, the like, or a combination thereof. In some embodiments, the solder resist 308 is formed on the substrate core 310 and the conductive connectors 314 may be disposed in openings in the solder resist 308 to be electrically and mechanically coupled to the bond pads 312. The solder resist 308 may be used to protect areas of the substrate core 310 from external damage.

In some embodiments, passive devices (e.g., surface mount devices (SMDs), not shown) may also be attached to the first package component 200 (e.g., to the UBMs 304) or to the package substrate 300 (e.g., to the bond pads 306). For example, the passive devices may be bonded to a same surface of the first package component 200 or the package substrate 300 as the conductive connectors 302. The passive devices may be attached to the first package component 200 prior to mounting the first package component 200 on the package substrate 300, or may be attached to the package substrate 300 prior to or after mounting the first package component 200 on the package substrate 300.

A second package component 400 is coupled to the first package component 200 using conductive connectors 418. The conductive connectors 418 may be disposed over and be electrically connected to a metallization pattern of the back-side redistribution structure 222 of the first package component 200. The second package component 400 includes, for example, a substrate 412 and one or more stacked dies 402 (e.g., 402A and 402B) coupled to the substrate 412. Although one set of stacked dies 402 (402A and 402B) is illustrated, in other embodiments, a plurality of stacked dies 402 (each having one or more stacked dies) may be disposed side-by-side coupled to a same surface of the substrate 412. The substrate 412 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 412 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 412 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 412.

The substrate 412 may include active and passive devices (not shown). A wide variety of devices such as transistors, capacitors, resistors, combinations of these, and the like may be used to generate the structural and functional requirements of the design for the second package component 400. The devices may be formed using any suitable methods.

The substrate 412 may also include metallization layers (not shown) and the conductive vias 414. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 412 is substantially free of active and passive devices.

The substrate 412 may have bond pads 410 on a first side of the substrate 412 to couple to the stacked dies 402, and bond pads 416 on a second side of the substrate 412, the second side being opposite the first side of the substrate 412, to couple to the conductive connectors 418. In some embodiments, the bond pads 410 and 416 are formed by forming recesses (not shown) into dielectric layers (not shown) on the first and second sides of the substrate 412. The recesses may be formed to allow the bond pads 410 and 416 to be embedded into the dielectric layers. In other embodiments, the recesses are omitted as the bond pads 410 and 416 may be formed on the dielectric layer. In some embodiments, the bond pads 410 and 416 include a thin seed layer (not shown) made of copper, titanium, nickel, gold, palladium, the like, or a combination thereof. The conductive material of the bond pads 410 and 416 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 410 and 416 is copper, tungsten, aluminum, silver, gold, the like, or a combination thereof.

In some embodiments, the bond pads 410 and the bond pads 416 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 410 and 416. Any suitable materials or layers of material that may be used for the bond pads 410 and 416 are fully intended to be included within the scope of the current application. In some embodiments, the conductive vias 414 extend through the substrate 412 and couple at least one of the bond pads 410 to at least one of the bond pads 416.

In the illustrated embodiment, the stacked dies 402 are coupled to the substrate 412 by wire bonds 406, although other connections may be used, such as conductive bumps. In an embodiment, the stacked dies 402 are stacked memory dies. For example, the stacked dies 402 may be memory dies such as dynamic random access memory (DRAM) dies, static random access memory (SRAM) dies, low-power (LP) double data rate (DDR) memory modules, such as LPDDR1, LPDDR2, LPDDR3, LPDDR4, or the like memory modules.

The stacked dies 402 and the wire bonds 406 may be encapsulated by a molding material 408. The molding material 408 may be molded on the stacked dies 402 and the wire bonds 406, for example, using compression molding. In some embodiments, the molding material 408 is a molding compound, a polymer, an epoxy, silicon oxide filler material, the like, or a combination thereof. A curing process may be performed to cure the molding material 408; the curing process may be a thermal curing, a UV curing, the like, or a combination thereof.

Figure 17:
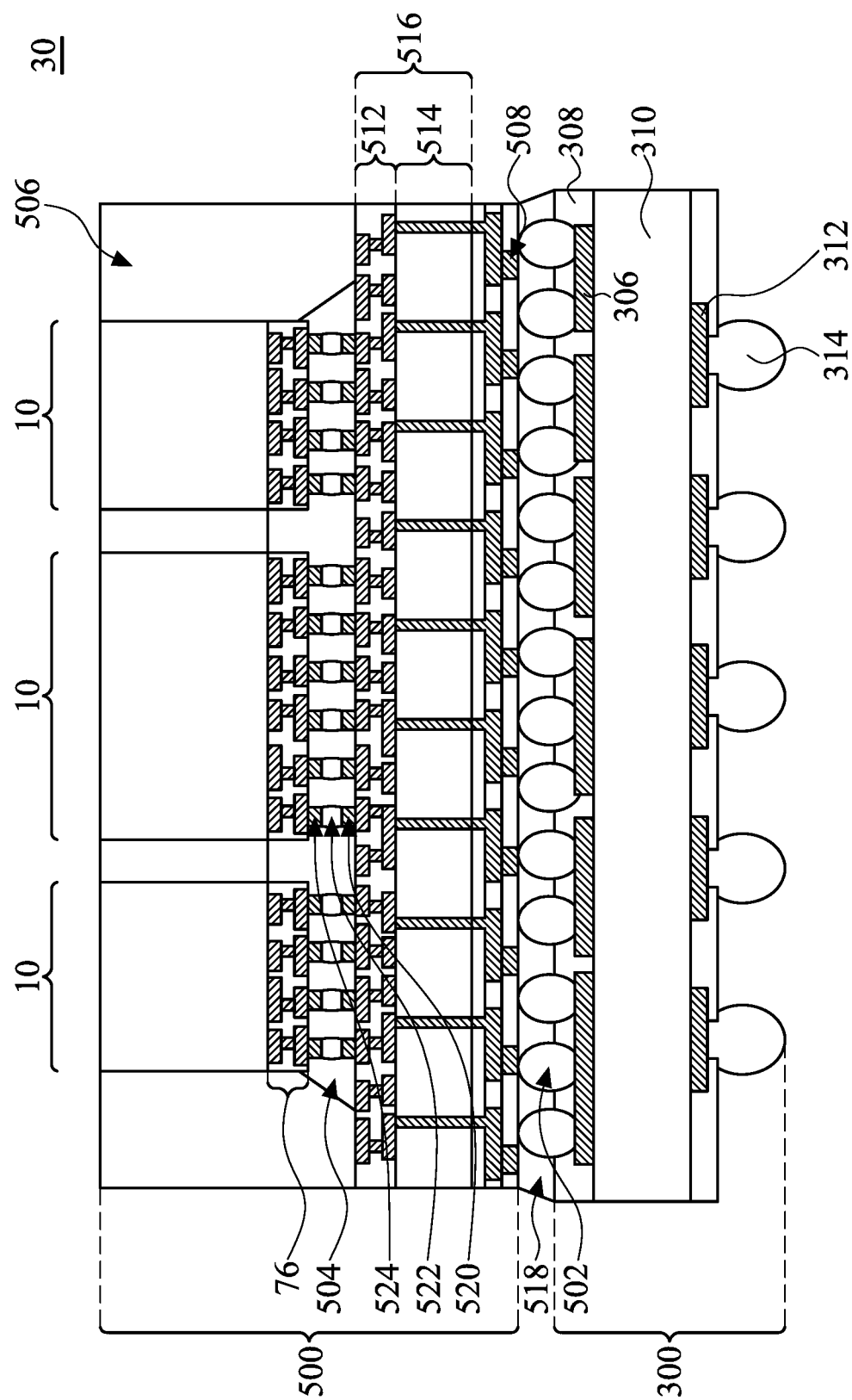
FIG. 17 illustrates a cross-sectional view of a package 30 in accordance with an alternate embodiment.

FIG. 17 illustrates a cross-sectional view of a package 30, in accordance with some embodiments. Unless specified otherwise, like reference numerals in this embodiment (and subsequently discussed embodiments) represent like components in the embodiments shown in FIGS. 1 through 16 formed by like processes. Accordingly, the process steps and applicable materials may not be repeated herein. One or more integrated circuit device stacks 10 described in FIGS. 1 through 15 are further packaged to form the package 30. The package 30 may also be referred to as a chip-on-wafer-on-substrate (CoWoS) package.

FIG. 16 illustrates a specific package configuration. Other package configurations may also be used in other embodiments. In FIG. 17, a third package component 500 is shown which may include one or more of the integrated circuit device stacks 10. In an embodiment, the third package component 500 may also include further integrated circuit devices, such as transistors, capacitors, inductors, resistors, metallization layers, conductive connectors, and the like, therein, as desired for a particular functionality. In some embodiments, the third package component 500 may include more than one of the same type of device, or may include different devices. FIG. 17 shows the third package component 500 comprising three of the integrated circuit device stacks 10 (described earlier in FIGS. 1 through 15) which are encapsulated and connected with redistribution structures and contact pads. In other embodiments, the third package component 500 may comprise any number of integrated circuit device stacks 10.

The third package component 500 may also comprise an interposer 516 that includes a substrate 514 and an interconnect structure 512. Each integrated circuit device stack 10 is attached to the interconnect structure 512, for example, through flip-chip bonding by way of the electrical connectors 520/522 and metal pillars 524. The metal pillars 524 are formed on the redistribution structure 170 of each integrated circuit device stack 10, and electrical connectors 520/522 are formed at the top surface of the interconnect structure 512 on conductive pads that are formed in the dielectric layers of the interconnect structure 512. In some embodiments, the electrical connectors 520/522 include metal pillars 520 with metal cap layers 522, which may be solder caps, over the metal pillars 520. The electrical connectors 520/522 (including the pillars 520 and the cap layers 522) are sometimes referred to as micro bumps 520/522. In some embodiments, the metal pillars 520 include a conductive material such as copper, aluminum, gold, nickel, palladium, the like, or a combination thereof and may be formed by sputtering, printing, electro plating, electroless plating, CVD, or the like. The metal pillars 520 may be solder-free and have substantially vertical sidewalls. In some embodiments, respective metal cap layers 522 are formed on the respective top surfaces of the metal pillars 520. The metal cap layers 522 may include nickel, tin, tin-lead, gold, copper, silver, palladium, indium, nickel-palladium-gold, nickel-gold, the like, or a combination thereof and may be formed by a plating process. The metal pillars 524 may be similar to the metal pillars 520 and their description is not repeated herein.

In another embodiment, the electrical connectors 520/522 do not include the metal pillars and are solder balls and/or bumps, such as controlled collapse chip connection (C4), electroless nickel immersion Gold (ENIG), electroless nickel electroless palladium immersion gold technique (ENEPIG) formed bumps, or the like. In such embodiments, the bump electrical connectors 520/522 may include a conductive material such as solder, copper, aluminum, gold, nickel, silver, palladium, tin, the like, or a combination thereof. The electrical connectors 520/522 may be formed by initially forming a layer of solder through methods such as evaporation, electroplating, printing, solder transfer, ball placement, or the like. Once a layer of solder has been formed on the structure, a reflow may be performed in order to shape the material into the desired bump shapes.

In an embodiment, the integrated circuit device stacks 10 are bonded to the interconnect structure 512 by a reflow process. During this reflow process, the electrical connectors 520/522/524 are in contact to physically and electrically couple the integrated circuit device stacks 10 to the interconnect structure 512.

The third package component 500 may also comprise an underfill material 504 dispensed between the integrated circuit device stacks 10 and the interconnect structure 512. In some embodiments, the third package component 500 may comprise an encapsulant 506 that surrounds each of the integrated circuit device stacks 10.

Still referring to FIG. 17, a package substrate 300 (described previously in FIG. 16) may be coupled to the third package component 500 using conductive connectors 502. The conductive connectors 502 may be coupled to the bond pads 306. The conductive connectors 502 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 502 may include a conductive material such as solder, copper, aluminum, gold, nickel, silver, palladium, tin, the like, or a combination thereof. In some embodiments, a solder resist 308 is formed on the substrate core 310 and the conductive connectors 502 may be disposed in openings in the solder resist 308 to be electrically and mechanically coupled to the bond pads 306. The solder resist 308 may be used to protect areas of the substrate core 310 from external damage.

The third package component 500 is placed on the conductive connectors 502 of the package substrate 300, making electrical connection between the third package component 500 and the package substrate 300. The third package component 500 may be placed such that conductive bumps 508 are aligned with the conductive connectors 502 of the package substrate 300. Once in physical contact, a reflow process may be utilized to bond the conductive connectors 502 of the package substrate 300 to the third package component 500. An underfill 518 may then be formed between the third package component 500 and the package substrate 300, surrounding the conductive connectors 502.

Figure 18:
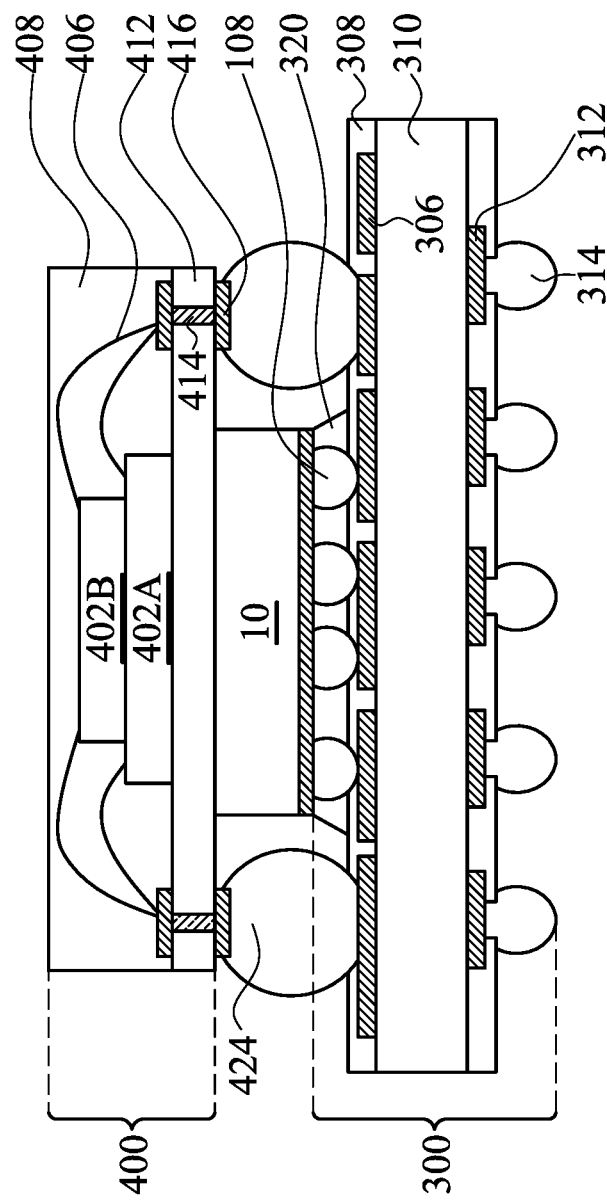
FIG. 18 illustrates a cross-sectional view of a package 40 in accordance with an alternate embodiment.

FIG. 18 illustrates a cross-sectional view of a package 40, in accordance with some embodiments. Unless specified otherwise, like reference numerals in this embodiment (and subsequently discussed embodiments) represent like components in the embodiments shown in FIGS. 1 through 17 formed by like processes. Accordingly, the process steps and applicable materials may not be repeated herein. One or more integrated circuit device stacks 10 described in FIGS. 1 through 15 are further packaged to form the package 40.

In FIG. 18, an integrated circuit device stack 10 is attached to a package substrate 300 (described previously in FIGS. 16 and 17), for example, through flip-chip bonding by way of the conductive connectors 108 (described previously in FIG. 14) on the redistribution structure 170 of the integrated circuit device stack 10. In some embodiments, the conductive connectors 108 are reflowed to attach the integrated circuit device stack 10 to the bond pads 306 of the package substrate 300. The conductive connectors 108 electrically and/or physically couple the package substrate 300, including metallization layers in the substrate core 310, to the integrated circuit device stack 10. In some embodiments, a solder resist 308 is formed on the substrate core 310. The conductive connectors 108 may be disposed in openings in the solder resist 308 to be electrically and mechanically coupled to the bond pads 306. The solder resist 308 may be used to protect areas of the substrate core 310 from external damage.

The conductive connectors 108 may have an epoxy flux (not shown) formed thereon before they are reflowed with at least some of the epoxy portion of the epoxy flux remaining after the integrated circuit device stack 10 is attached to the package substrate 300. This remaining epoxy portion may act as an underfill to reduce stress and protect the joints resulting from reflowing the conductive connectors 108. In some embodiments, an underfill 320 may be formed between the integrated circuit device stack 10 and the package substrate 300 and surrounding the conductive connectors 108. The underfill 320 may be formed by a capillary flow process after the first package component 200 is attached or may be formed by a suitable deposition method before the integrated circuit device stack 10 is attached.

A second package component 400 (described previously in FIG. 16) is coupled to the package substrate 300 using conductive connectors 424. Conductive connectors 424 may be coupled to the bond pads 306 of the package substrate 300 and the bond pads 416 of the second package component 400 to allow for the electrical coupling of the package substrate 300 to the second package component 400. The conductive connectors 424 may be ball grid array (BGA) connectors, solder balls, metal pillars, controlled collapse chip connection (C4) bumps, or the like. The conductive connectors 424 may include a conductive material such as solder, copper, aluminum, gold, nickel, silver, palladium, tin, the like, or a combination thereof.

The embodiments of the present disclosure have some advantageous features. The embodiments include bonding semiconductor dies to a substrate, and performing a plasma treatment to dope top surfaces and sidewalls of each of the semiconductor dies with a suitable dopant (e.g., fluorine). A doping concentration of the dopant in respective sidewalls of each of the semiconductor dies may decrease in a vertical direction away from the top surfaces of the semiconductor dies. A gap-filling process is then performed to fill gaps between the semiconductor dies with a dielectric material.

One or more embodiments disclosed herein may allow for achieving an increased hydrophobicity of the top surfaces and upper sidewalls of the semiconductor dies compared to lower sidewalls of the semiconductor dies. For example, the hydrophobicity of the sidewalls of the semiconductor dies decreases in a vertical direction away from the top surface of the semiconductor dies. As a result, during the gap-filling process, the increased hydrophobicity of top portions of the semiconductor dies compared to bottom portions of the semiconductor dies may allow for the dielectric material to fill and adhere to the bottom portions of the semiconductor dies before filling and adhering to the top portions of the semiconductor dies. This allows the gap to be filled from the bottom-up, allowing for gaps of a larger depth to be filled without the formation of large voids. As a result, device reliability and performance are improved. The bottom-up filling process may further reduce the roughness of the dielectric material, allowing for an improved interface with overlying structures of the integrated circuit package and improved device reliability. In addition, after the gap-filling process, no residue accumulates on the top surfaces of the semiconductor dies, removing the need for a cleaning process after the gap-filling process is performed and reducing manufacturing costs.

In accordance with an embodiment, a method includes bonding a first semiconductor die and a second semiconductor die to a substrate, where a gap is disposed between a first sidewall of the first semiconductor die and a second sidewall of the second semiconductor die; performing a plasma treatment to dope top surfaces and sidewalls of each of the first semiconductor die and the second semiconductor die with a first dopant, where a concentration of the first dopant in the first sidewall decreases in a vertical direction from a top surface of the first semiconductor die towards a bottom surface of the first semiconductor die, and a concentration of the first dopant in the second sidewall decreases in a vertical direction from a top surface of the second semiconductor die towards a bottom surface of the second semiconductor die; and filling the gap with a spin-on dielectric material. In an embodiment, performing the plasma treatment includes exposing the top surface and the sidewalls of each of the first semiconductor die and the second semiconductor die to a fluorine plasma. In an embodiment, the fluorine plasma is generated from a gas mixture that includes $CF_4$, $C_2F_6$, or $C_4F_8$. In an embodiment, a dopant depth of the first sidewall decreases in the vertical direction from the top surface of the first semiconductor die towards the bottom surface of the first semiconductor die, and a dopant depth of the second sidewall decreases in the vertical direction from the top surface of the second semiconductor die moving towards the bottom surface of the second semiconductor die. In an embodiment, filling the gap with the spin-on dielectric material includes spin-coating a silicon containing liquid precursor over the substrate to fill the gap with the silicon containing liquid precursor. In an embodiment, the method further includes after filling the gap with the spin-on dielectric material, planarizing top surfaces of the first semiconductor die, the second semiconductor die, and the spin-on dielectric material, where after planarizing the top surfaces of the first semiconductor die, the second semiconductor die, and the spin-on dielectric material, the arithmetic average roughness (Ra) of the spin-on dielectric material is less than or equal to 10 Angstroms. In an embodiment, after planarizing the top surfaces of the first semiconductor die, the second semiconductor die, and the spin-on dielectric material, a top surface of a central region of each of the first semiconductor die and the second semiconductor die is not doped. In an embodiment, after planarizing the top surfaces of the first semiconductor die, the second semiconductor die, and the spin-on dielectric material, bonding a third semiconductor die to the first semiconductor die, and bonding a fourth semiconductor die to the second semiconductor die.

In accordance with an embodiment, a method includes bonding a plurality of dies to a first substrate, each of the plurality of dies including a semiconductor substrate; and an interconnect structure on the semiconductor substrate; after bonding the plurality of dies to the first substrate, doping top surfaces and sidewalls of each semiconductor substrate of the plurality of dies with a first dopant such that a hydrophobicity of the sidewalls of each semiconductor substrate decreases in the vertical direction from a top surface of the semiconductor substrate towards a bottom surface of the semiconductor substrate; and forming a dielectric material between each of the plurality of dies. In an embodiment, a concentration of the first dopant in the sidewalls of each semiconductor substrate decreases in the vertical direction from a top surface of the semiconductor substrate towards the bottom surface of the semiconductor substrate. In an embodiment, doping the top surfaces and the sidewalls of each semiconductor substrate of the plurality of dies includes exposing the top surfaces and the sidewalls of each semiconductor substrate to a fluorine plasma. In an embodiment, the fluorine plasma is generated from a gas mixture that includes $CF_4$, $C_2F_6$, or $C_4F_8$. In an embodiment, doping the top surfaces and the sidewalls of each semiconductor substrate includes performing an ion beam implantation process to introduce the first dopant into the top surfaces and the sidewalls of each semiconductor substrate. In an embodiment, the ion beam implantation process includes directing an implantation species at a tilt angle that is in a range from 0° to 15° with respect to an axis that is perpendicular to the major surface of the first substrate. In an embodiment, forming the dielectric material between each of the plurality of dies includes spin-coating a silicon containing liquid precursor over the first substrate to fill a gap between each of the plurality of dies with the silicon containing liquid precursor, where after spin-coating the silicon containing liquid precursor over the first substrate, a topmost point of the silicon containing liquid precursor is below top surfaces of the plurality of dies; and performing a curing process to form a solid phase of the dielectric material in the gap.

In accordance with an embodiment, a package includes a redistribution structure; a first die over and electrically coupled to the redistribution structure; and a first dielectric material encapsulating the first die, where sidewalls of the first die include a first dopant, where a concentration of the first dopant in the sidewalls of the first die decreases in the vertical direction from a top surface of the first die towards a bottom surface of the first die. In an embodiment, the first dopant is fluorine. In an embodiment, the hydrophobicity of the sidewalls of the first die decreases in the vertical direction from the top surface of the first die towards the bottom surface of the first die. In an embodiment, the package further includes a second die over and bonded to the first die, a second dielectric material encapsulating the second die, where sidewalls of the second die include the first dopant, where a concentration of the first dopant in the sidewalls of the second die decreases in the vertical direction from a top surface of the second die towards a bottom surface of the second die. In an embodiment, the second dielectric material is silicon oxide, and the second dielectric material overlaps a portion of the top surface of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first semiconductor die and a second semiconductor die to a substrate, wherein a gap is disposed between a first sidewall of the first semiconductor die and a second sidewall of the second semiconductor die;
   performing a plasma treatment to dope top surfaces and sidewalls of each of the first semiconductor die and the second semiconductor die with a first dopant, wherein a concentration of the first dopant in the first sidewall decreases in a vertical direction from a top surface of the first semiconductor die towards a bottom surface of the first semiconductor die, and a concentration of the first dopant in the second sidewall decreases in a vertical direction from a top surface of the second semiconductor die towards a bottom surface of the second semiconductor die; and
   filling the gap with a spin-on dielectric material.

2. The method of claim 1, wherein performing the plasma treatment comprises exposing the top surface and the sidewalls of each of the first semiconductor die and the second semiconductor die to a fluorine plasma.

3. The method of claim 2, wherein the fluorine plasma is generated from a gas mixture that comprises $CF_4$, $C_2F_6$, or $C_4F_8$.

4. The method of claim 1, wherein a dopant depth of the first sidewall decreases in the vertical direction from the top surface of the first semiconductor die towards the bottom surface of the first semiconductor die, and a dopant depth of the second sidewall decreases in the vertical direction from the top surface of the second semiconductor die moving towards the bottom surface of the second semiconductor die.

5. The method of claim 1, wherein filling the gap with the spin-on dielectric material comprises spin-coating a silicon containing liquid precursor over the substrate to fill the gap with the silicon containing liquid precursor.

6. The method of claim 5, further comprising:
   after filling the gap with the spin-on dielectric material, planarizing top surfaces of the first semiconductor die, the second semiconductor die, and the spin-on dielectric material, wherein after planarizing the top surfaces of the first semiconductor die, the second semiconductor die, and the spin-on dielectric material, the arithmetic average roughness (Ra) of the spin-on dielectric material is less than or equal to 10 Angstroms.

7. The method of claim 6, wherein after planarizing the top surfaces of the first semiconductor die, the second semiconductor die, and the spin-on dielectric material, a top surface of a central region of each of the first semiconductor die and the second semiconductor die is not doped.

8. The method of claim 6, wherein after planarizing the top surfaces of the first semiconductor die, the second semiconductor die, and the spin-on dielectric material, bonding a third semiconductor die to the first semiconductor die, and bonding a fourth semiconductor die to the second semiconductor die.

9. A method comprising:
   bonding a plurality of dies to a first substrate, each of the plurality of dies comprising:
      a semiconductor substrate; and
      an interconnect structure on the semiconductor substrate;
   after bonding the plurality of dies to the first substrate, doping top surfaces and sidewalls of each semiconductor substrate of the plurality of dies with a first dopant such that a hydrophobicity of the sidewalls of each semiconductor substrate decreases in the vertical direction from a top surface of the semiconductor substrate towards a bottom surface of the semiconductor substrate; and
   forming a dielectric material between each of the plurality of dies.

10. The method of claim 9, wherein a concentration of the first dopant in the sidewalls of each semiconductor substrate decreases in the vertical direction from a top surface of the semiconductor substrate towards the bottom surface of the semiconductor substrate.

11. The method of claim 9, wherein doping the top surfaces and the sidewalls of each semiconductor substrate of the plurality of dies comprises exposing the top surfaces and the sidewalls of each semiconductor substrate to a fluorine plasma.

12. The method of claim 11, wherein the fluorine plasma is generated from a gas mixture that comprises $CF_4$, $C_2F_6$, or $C_4F_8$.

13. The method of claim 9, wherein doping the top surfaces and the sidewalls of each semiconductor substrate comprises performing an ion beam implantation process to introduce the first dopant into the top surfaces and the sidewalls of each semiconductor substrate.

14. The method of claim 13, wherein the ion beam implantation process comprises directing an implantation species at a tilt angle that is in a range from 0° to 15° with respect to an axis that is perpendicular to the major surface of the first substrate.

15. The method of claim 9, wherein forming the dielectric material between each of the plurality of dies comprises:
   spin-coating a silicon containing liquid precursor over the first substrate to fill a gap between each of the plurality of dies with the silicon containing liquid precursor, wherein after spin-coating the silicon containing liquid precursor over the first substrate, a topmost point of the silicon containing liquid precursor is below top surfaces of the plurality of dies; and
   performing a curing process to form a solid phase of the dielectric material in the gap.

16. A package comprising:
a redistribution structure;
a first die over and electrically coupled to the redistribution structure; and
a first dielectric material encapsulating the first die, wherein sidewalls of the first die comprise a first dopant, wherein a concentration of the first dopant in the sidewalls of the first die decreases in the vertical direction from a top surface of the first die towards a bottom surface of the first die.

17. The package of claim 16, wherein the first dopant is fluorine.

18. The package of claim 16, wherein the hydrophobicity of the sidewalls of the first die decreases in the vertical direction from the top surface of the first die towards the bottom surface of the first die.

19. The package of claim 16, further comprising a second die over and bonded to the first die, a second dielectric material encapsulating the second die, wherein sidewalls of the second die comprise the first dopant, wherein a concentration of the first dopant in the sidewalls of the second die decreases in the vertical direction from a top surface of the second die towards a bottom surface of the second die.

20. The package of claim 19, wherein the second dielectric material is silicon oxide, and the second dielectric material overlaps a portion of the top surface of the first die.

* * * * *